(12) United States Patent
Kim et al.

(10) Patent No.: US 11,959,969 B2
(45) Date of Patent: Apr. 16, 2024

(54) APPARATUS AND METHOD FOR DIAGNOSING BATTERY

(71) Applicant: LG ENERGY SOLUTION, LTD., Seoul (KR)

(72) Inventors: Young Jin Kim, Daejeon (KR); Won Tae Joe, Daejeon (KR); Bom Jin Lee, Daejeon (KR); Bo Mi Lim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 115 days.

(21) Appl. No.: 17/773,900

(22) PCT Filed: May 12, 2021

(86) PCT No.: PCT/KR2021/005917
§ 371 (c)(1),
(2) Date: May 3, 2022

(87) PCT Pub. No.: WO2021/230642
PCT Pub. Date: Nov. 18, 2021

(65) Prior Publication Data
US 2022/0390521 A1     Dec. 8, 2022

(30) Foreign Application Priority Data
May 15, 2020  (KR) .......................... 10-2020-0058588

(51) Int. Cl.
*G01R 31/3835* (2019.01)
*G01R 31/36* (2020.01)
*G01R 31/396* (2019.01)

(52) U.S. Cl.
CPC ..... *G01R 31/3835* (2019.01); *G01R 31/3648* (2013.01); *G01R 31/396* (2019.01)

(58) Field of Classification Search
CPC .......................... G01R 31/3835; G01R 31/396
(Continued)

(56) References Cited

U.S. PATENT DOCUMENTS

| 6,486,637 B1 | 11/2002 | Nakanishi et al. |
| 2011/0313613 A1 | 12/2011 | Kawahara et al. |

(Continued)

FOREIGN PATENT DOCUMENTS

| CN | 102667513 B | 3/2015 |
| EP | 1 096 636 A2 | 5/2001 |

(Continued)

OTHER PUBLICATIONS

International Search Report (PCT/ISA/210) issued in PCT/KR2021/005917 dated Aug. 19, 2021.
(Continued)

*Primary Examiner* — Ricky Go
(74) *Attorney, Agent, or Firm* — Birch, Stewart, Kolasch & Birch, LLP

(57) ABSTRACT

There is provided an apparatus for diagnosing whether or not an error has occurred in battery cells, the apparatus including a voltage measurement circuit for measuring a voltage of a battery cell, a data processing circuit for calculating a target statistical value indicating a state of the battery cell based on a voltage measured by the voltage measurement circuit, and calculates a cumulative statistical value, and a diagnosis circuit that determines whether or not an error has occurred in the battery cell through a cumulative determination operation of comparing the cumulative statistical value with a cumulative reference value, and counts a number of times of cumulative error when it is determined that the error has occurred in the battery cell in the cumulative determination operation.

20 Claims, 22 Drawing Sheets

(58) Field of Classification Search
USPC .......................................................... 702/63
See application file for complete search history.

(56) References Cited

U.S. PATENT DOCUMENTS

| | | | |
|---|---|---|---|
| 2012/0086399 | A1 | 4/2012 | Choi |
| 2012/0116609 | A1 | 5/2012 | Jung et al. |
| 2012/0262180 | A1 | 10/2012 | Ishishita |
| 2012/0290234 | A1* | 11/2012 | Schaefer ................. B60L 58/22 320/135 |
| 2012/0315560 | A1 | 12/2012 | Masui |
| 2015/0232081 | A1* | 8/2015 | Slosarczyk ........ G01R 31/3648 701/22 |
| 2015/0349387 | A1 | 12/2015 | Inaba et al. |
| 2017/0259687 | A1* | 9/2017 | Chikkannanavar .......................... H02J 7/00308 |
| 2017/0279283 | A1 | 9/2017 | Kim et al. |
| 2017/0350946 | A1 | 12/2017 | Mukaitani et al. |
| 2017/0351561 | A1* | 12/2017 | Yamazoe ............ G06F 11/0745 |
| 2019/0077265 | A1 | 3/2019 | Ono et al. |
| 2020/0144812 | A1* | 5/2020 | Shin ..................... H01M 10/48 |

FOREIGN PATENT DOCUMENTS

| | | | |
|---|---|---|---|
| JP | 2004-247319 A | 9/2004 |
| JP | 2010-257279 A | 11/2010 |
| JP | 2011-54413 A | 3/2011 |
| JP | 2013-64649 A | 4/2013 |
| JP | 2013-118757 A | 6/2013 |
| JP | 2013-195129 A | 9/2013 |
| JP | 2013-254664 A | 12/2013 |
| JP | 2015-31674 A | 2/2015 |
| JP | 2016-90416 A | 5/2016 |
| JP | 2017-46447 A | 3/2017 |
| JP | 2017-156268 A | 9/2017 |
| JP | 2018-44927 A | 8/2018 |
| JP | 6635743 B2 | 1/2020 |
| KR | 10-1182431 B1 | 9/2012 |
| KR | 10-1189342 B1 | 10/2012 |
| KR | 10-1210523 B1 | 12/2012 |
| KR | 10-1354081 B1 | 1/2014 |
| KR | 10-1667913 B1 | 10/2016 |
| KR | 10-2017-0102598 A | 9/2017 |
| KR | 10-1865402 B1 | 7/2018 |
| KR | 10-1899839 B1 | 9/2018 |
| KR | 10-2019-0073654 A | 6/2019 |
| KR | 10-2035675 B1 | 10/2019 |
| KR | 10-2062813 B1 | 1/2020 |
| KR | 10-2020-0027326 A | 3/2020 |
| WO | WO 2010/109956 A1 | 9/2010 |
| WO | WO 2011/108317 A1 | 9/2011 |
| WO | WO 2014/132321 A1 | 9/2014 |
| WO | WO 2017/130258 A1 | 8/2017 |

OTHER PUBLICATIONS

Extended European Search Report for European Application No. 21803824.8, dated Sep. 12, 2023.

* cited by examiner

APPARATUS AND METHOD FOR DIAGNOSING BATTERY

CROSS-REFERENCE TO RELATED APPLICATIONS

This application claims the benefit of Korean Patent Application No. 10-2020-0058588, filed on May 15, 2020, in the Korean Intellectual Property Office, the disclosure of which is incorporated herein in its entirety by reference.

TECHNICAL FIELD

The present invention relates to an apparatus for diagnosing a battery, and more particularly, to an apparatus for diagnosing whether or not an error has occurred in battery cells by measuring a voltage of each of the battery cells.

BACKGROUND ART

Recently, research and development on a secondary battery are being actively conducted. Here, the secondary battery is a battery capable of charging and discharging, and includes all of a conventional Ni/Cd battery, Ni/MH battery, etc., and a recent lithium ion battery. Among the secondary batteries, the lithium ion battery has an advantage of having much higher energy density compared to the conventional Ni/Cd battery, Ni/MH battery, etc. The lithium ion battery can be manufactured in a small size and light weight, and thus the lithium ion battery is used as a power source for a mobile device. In particular, the lithium ion battery can be used as a power source for an electric vehicle, and thus attracts attention as a next-generation energy storage medium as its range of use has been expanded to a power source for an electric vehicle.

In addition, the secondary battery is generally used as a battery pack including a battery module in which a plurality of battery cells are connected in series and/or in parallel. The state and operation of the battery pack are managed and controlled by a battery management system. The battery cells in the battery pack are charged by receiving power from the outside.

Charged battery cells provide power to various devices and/or circuits connected to the battery pack. When the battery cell fails, power is not properly supplied to various devices and/or circuits, and thus a fatal accident may occur. Therefore, it is important to monitor the battery cells to diagnose whether or not an error has occurred in the battery cells. In addition, for an accurate diagnosis, a problem arises as to which diagnostic criteria and which diagnostic method to use.

DISCLOSURE OF THE INVENTION

Technical Problem

The present invention is intended to solve the technical problem described above, and an object thereof is to provide an apparatus for diagnosing a battery that determines whether or not an error has occurred in a battery cell based on a voltage tendency of battery cells and finally determines whether or not the battery cell is defective by accumulating measured values of the battery cell.

Technical Solution

An apparatus for diagnosing a battery according to an embodiment of the present invention may include a voltage measurement circuit, a data processing circuit, and a diagnosis circuit. The voltage measurement circuit may measure a voltage of a battery cell of the battery. The data processing circuit may calculate a target statistical value indicating a state of the battery cell based on a voltage measured by the voltage measurement circuit, and may calculate a cumulative statistical value by accumulating target statistical values of the battery cell during an analysis period. The diagnosis circuit may determine whether or not an error has occurred in the battery cell through a cumulative determination operation of comparing the cumulative statistical value with a cumulative reference value, and count a number of times of cumulative error when it is determined that the error has occurred in the battery cell in the cumulative determination operation.

A method for diagnosing a battery according to an embodiment of the present invention may include a voltage measurement step of measuring, by an apparatus for diagnosing, a voltage between an input terminal and an output terminal of a battery cell of the battery, a calculation step of calculating, by the apparatus for diagnosing, a target statistical value indicating a state of the battery cell based on the voltage measured in the voltage measurement step, and calculating a cumulative statistical value by accumulating target statistical values of the battery cell during an analysis period, and a first diagnosis step of determining, by the apparatus for diagnosing, whether or not an error has occurred in the battery cell through a cumulative determination operation of comparing the cumulative statistical value with a cumulative reference value and counting a number of times of cumulative error when it is determined that the error has occurred in the battery cell through the cumulative determination operation.

Advantageous Effects

According to the present invention, it is possible to determine whether or not an error has occurred in a battery cell through an absolute determination, a relative determination, and a cumulative determination. According to the present invention, it is possible to more accurately determine whether or not the battery cell is defective by synthesizing the results of the absolute determination, the relative determination, and the cumulative determination.

MODE FOR CARRYING OUT THE INVENTION

Hereinafter, embodiments of the present invention will be described clearly and in detail to the extent that those skilled in the art can easily embody the present invention.

Figure 1:
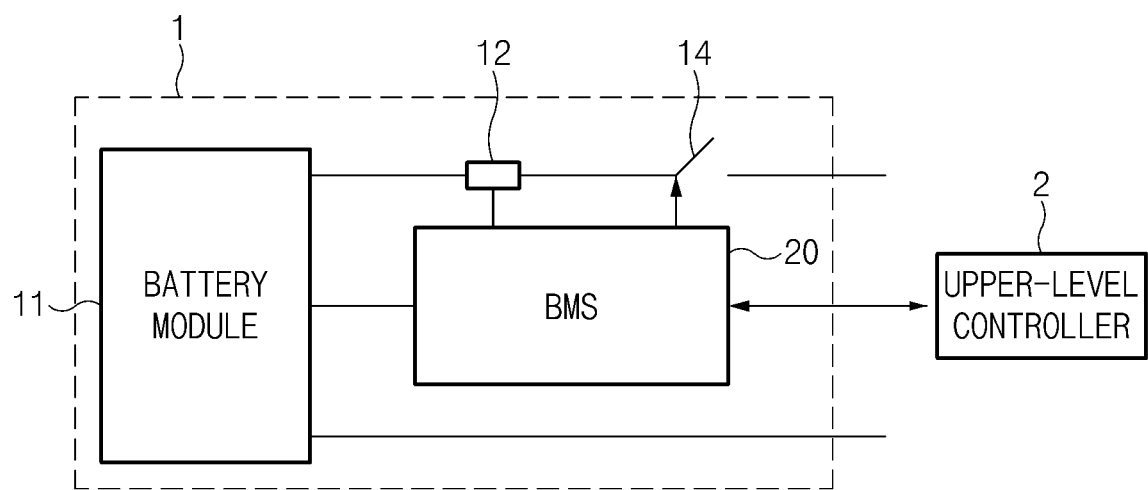
FIG. 1 is a block diagram illustrating a configuration of a battery control system.

FIG. 1 is a block diagram illustrating a configuration of a battery control system.

Referring to FIG. 1, a battery management system including a battery pack 1 and an upper-level controller 2 included in an upper-level system according to an embodiment of the present invention is schematically illustrated.

As illustrated in FIG. 1, the battery pack 1 includes a battery module 11 composed of one or more battery cells and capable of charging and discharging, a switching unit 14 connected in series to a positive terminal side or a negative terminal side of the battery module 11 to control a charge and discharge current flow of the battery module 11, and a battery management system 20 that monitors a voltage, current, temperature, etc. of the battery pack 1 to control and manage the battery module to prevent over-charging, over-discharging, etc.

Here, the switching unit 14 is a switching element for controlling a current flow for charging or discharging of the battery module 11 and, for example, a semiconductor switching element such as at least one MOSFET or a relay may be used.

In addition, the battery management system 20 may monitor the voltage, current, temperature, etc. of the battery pack 1, and may measure the current, voltage, temperature, etc. of the battery pack 1 using a sensor 12 provided adjacent to the semiconductor switching element 14. The battery management system 20 is an interface that receives values obtained by measuring various parameters described above, and may include a plurality of terminals and a circuit connected to these terminals to perform processing for input values.

In addition, the battery management system 20 may control ON/OFF of the switching element 14, for example, a MOSFET, and may be connected to the battery module 11 to monitor a state of the battery module 11.

The upper-level controller 2 may transmit a control signal for the battery module 11 to the battery management system 20. Accordingly, an operation of the battery management system 20 may be controlled based on a signal applied from the upper-level controller 2. The battery cell of the present invention may be configured to be included in a battery pack used in an energy storage system (ESS) or a vehicle, etc. However, the battery cell is not limited to these uses.

Since the configuration of the battery pack 1 and the configuration of the battery management system 20 are known configurations, a more detailed description thereof will be omitted.

Figure 2:
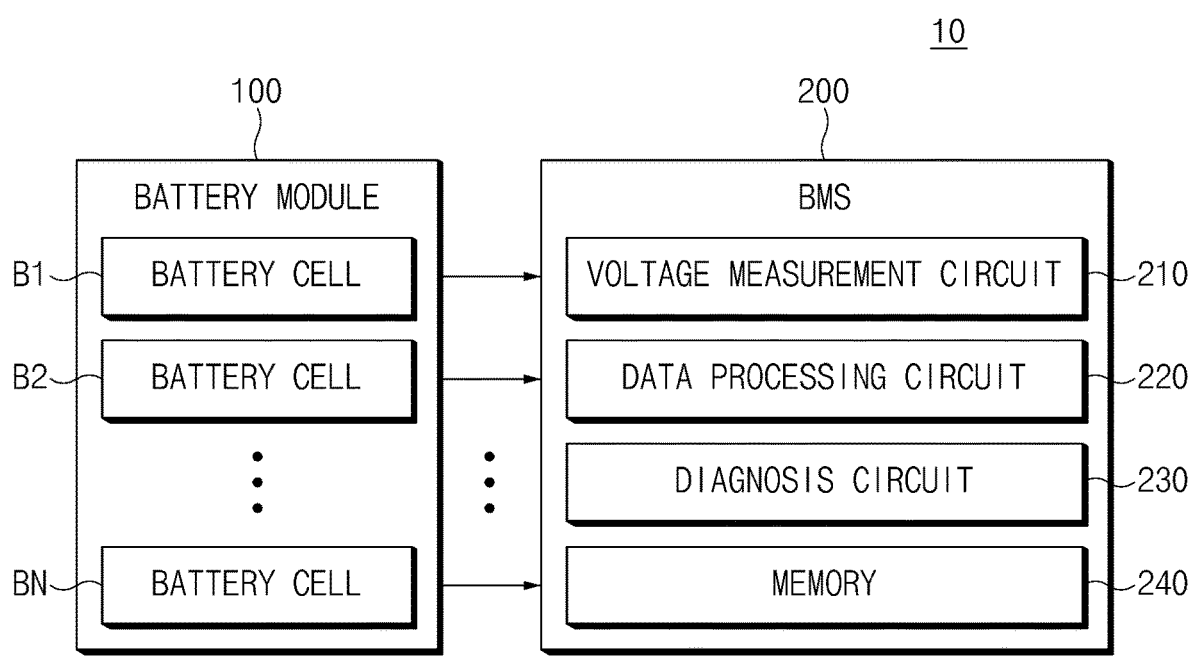
FIG. 2 is a block diagram illustrating a configuration of a battery pack 10 including an apparatus for diagnosing a battery of the present invention.

FIG. 2 is a block diagram illustrating the configuration of the battery pack 10 including the apparatus for diagnosing a battery of the present invention. A battery module 100 and a battery management system 200 of FIG. 2 may correspond to the battery module 11 and the battery management system 20 of FIG. 1.

The battery pack 10 may include the battery module 100 and the battery management system 200. The "apparatus for diagnosing a battery" of the present invention may be an apparatus including some or all components of the battery management system 200. For example, the "apparatus for diagnosing a battery" may include a voltage measurement circuit 210, a data processing circuit 220, a diagnosis circuit 230, and a memory 240.

The battery module 100 may include a plurality of battery cells B1 to BN. The plurality of battery cells B1 to BN may be configured to be connected in series and/or in parallel. Referring to FIG. 2, the battery pack 10 is illustrated as including one battery module 100, but the present invention is not limited thereto, and the battery pack 10 may include one or more battery modules.

In a charging section, the battery module 100 may receive power from a power supply. In the charging section, voltages at both ends of each of the battery cells B1 to BN may increase. In the following descriptions, "voltage of a battery cell" means "voltage between both ends of a battery cell". In a discharging section, the battery module 100 may supply power to external devices and/or circuits. There may be a rest section between the charging section and the discharging section. In the rest section, the battery module 100 may stop an operation of receiving power or supplying power. Therefore, in an ideal case, in the rest section, the voltage of the battery module 100 is maintained constant. When the battery module 100 is included in the electric vehicle, external devices and/or circuits may be a motor, a power control unit (PCU), an inverter, etc.

Due to an internal short-circuit or an external short-circuit of the battery cell, an abnormal voltage drop phenomenon may be detected in the battery cell. The abnormal voltage drop phenomenon means that the voltage of the battery cell is abnormally decreased in the charging section, the discharging section and/or the rest section. The battery management system 200 of the present invention may monitor the battery cells B1 to BN to determine whether or not the abnormal voltage drop phenomenon has occurred in the battery cells B1 to BN.

The battery management system 200 may include the voltage measurement circuit 210, the data processing circuit 220, the diagnosis circuit 230, and the memory 240. The battery management system 200 may more accurately determine whether or not the abnormal voltage drop phenomenon has occurred in the battery cells B1 to BN through an absolute determination operation, a relative determination operation, and a cumulative determination operation. In the following descriptions, checking whether or not the error has occurred in the battery cell B1 means checking whether or not the abnormal voltage drop phenomenon occurs in the battery cell B1. In addition, in the following descriptions, for convenience of description, a method for inspecting, by the battery management system 200, the battery cell B1 is intensively described. The battery management system 200 may also inspect the remaining battery cells B2 to BN in the same manner as the method for inspecting the battery cell B1.

First, how the battery management system 200 a method for performing, by the battery management system 200, an absolute determination operation is described. The absolute determination operation performed in the charging section and the discharging section may be different from the absolute determination operation performed in the rest section. In the following descriptions, the absolute determination operation performed in the charging section and the discharging section is expressed as a first absolute determination operation. The absolute determination operation performed in the rest section is expressed as a second absolute determination operation.

Hereinafter, a first absolute determination operation is described. The voltage measurement circuit 210 may measure a voltage of the battery cell B1 in the charging section and the discharging section. The voltage measurement circuit 210 may output voltage data for the measured voltage to the data processing circuit 220.

The data processing circuit 220 may process the voltage data received from the voltage measurement circuit 210 to calculate a first statistical value. For example, the first statistical value may be a value obtained by differentiating capacitance of the battery cell B1 with respect to the voltage. In order to calculate the first statistical value, the capacitance of the battery cell B1 may be measured by the battery management system 200. The first statistical value will be described in detail with reference to FIGS. 4 to 6F.

The diagnosis circuit 230 may receive information about the first statistical value. The diagnosis circuit 230 may compare the first statistical value with a first absolute reference value. The first absolute reference value may be a value set by a user. However, the present invention is not limited thereto, and the first absolute reference value may be a value determined based on the state of the battery cell B1, such as the temperature of the battery cell B1 and the state of charge (SOC) of the battery cell B1. The diagnosis circuit 230 may determine that an error has occurred in the battery cell B1 when the first statistical value is equal to or greater than the first absolute reference value.

Hereinafter, a second absolute determination operation is described. The voltage measurement circuit 210 may measure the voltage of the battery cell B1 in the rest section. The voltage measurement circuit 210 may output voltage data for the measured voltage to the data processing circuit 220.

The data processing circuit 220 may process the voltage data received from the voltage measurement circuit 210 to calculate a second statistical value. The second statistical value may be a value calculated by substituting the voltage data into a voltage fitting equation. The second statistical value will be described in detail with reference to FIGS. 7 to 8E.

The diagnosis circuit 230 may receive information about the second statistical value. The diagnosis circuit 230 may compare the second statistical value with a second absolute reference value. The second absolute reference value may be a value set by the user. However, the present invention is not limited thereto, and the second absolute reference value may be a value determined based on the state of the battery cell B1, such as the temperature of the battery cell B1 and the SOC of the battery cell B1. The diagnosis circuit 230 may determine that an error has occurred in the battery cell B1 when the second statistical value is equal to or greater than the second absolute reference value.

Secondly, a method for performing, by the battery management system 200, a relative determination operation is described. The relative determination operation performed in the charging section and the discharging section may be different from the relative determination operation performed in the rest section. In the following descriptions, the relative determination operation performed in the charging section and the discharging section is expressed as a first relative determination operation. The relative determination operation performed in the rest section is expressed as a second relative determination operation.

Hereinafter, the first relative determination operation is described. The voltage measurement circuit 210 may measure the voltage of each of the battery cells B1 to BN in the charging section and the discharging section. The voltage measurement circuit 210 may output voltage data for the measured voltages to the data processing circuit 220.

The data processing circuit 220 may process the voltage data received from the voltage measurement circuit 210 to calculate a first relative reference value. Specifically, the data processing circuit 220 may calculate the first statistical values of the battery cells B1 to BN in the same manner as the method of calculating the first statistical value of the battery cell B1 in the absolute determination operation. The data processing circuit 220 may determine the first relative reference value based on an 'n' sigma value of the first statistical values of the battery cells B1 to BN. Here, 'n' may be a positive number. As an example, the first relative reference value may be a +3 value of the first statistical values.

The diagnosis circuit 230 may receive information about the first statistical value and the first relative reference value of the battery cell B1. The diagnosis circuit 230 may compare the first statistical value with the first relative reference value. The diagnosis circuit 230 may determine that an error has occurred in the battery cell B1 when the first statistical value is equal to or greater than the first relative reference value.

Hereinafter, a second relative determination operation is described. The voltage measurement circuit 210 may measure the voltage of each of the battery cells B1 to BN in the rest section. The voltage measurement circuit 210 may output voltage data for the measured voltages to the data processing circuit 220.

The data processing circuit 220 may process the voltage data received from the voltage measurement circuit 210 to calculate a second relative reference value. Specifically, the data processing circuit 220 may calculate the second statistical values of the battery cells B1 to BN in the same manner as the method of calculating the second statistical value of the battery cell B1 in the absolute determination operation. The data processing circuit 220 may determine the second relative reference value based on a 'k' sigma value of the second statistical values of the battery cells B1 to BN. Here, 'k' may be a positive number. As an example, the second relative reference value may be a +3 sigma value of the second statistical values.

The diagnosis circuit 230 may receive information about the second statistical value and the second relative reference value of the battery cell B1. The diagnosis circuit 230 may compare the second statistical value with the second relative reference value. The diagnosis circuit 230 may determine that an error has occurred in the battery cell B1 when the second statistical value is equal to or greater than the second relative reference value.

Next, a method for performing, by the battery management system 200, a cumulative determination operation is described. The battery management system 200 may perform the absolute determination operation and the relative determination operation in each fixed cycle during the analysis period. By using data generated in the absolute determination operation and the relative determination operation, the battery management system 200 may perform the cumulative determination operation.

The data processing circuit 220 may calculate a cumulative statistical value by accumulating statistical values related to the voltage of the battery cell B1. For example, the data processing circuit 220 may calculate the cumulative statistical value by accumulating all statistical values calculated during the analysis period. As another example, the data processing circuit 220 may calculate the cumulative statistical value by selecting some of the statistical values calculated during the analysis period and accumulating the selected statistical values. Specifically, the data processing circuit 220 may calculate the cumulative statistical value by accumulating statistical values obtained at a specific time zone during the analysis period.

The data processing circuit 220 may calculate the cumulative reference value by accumulating relative reference values in a similar way to the way in calculating the cumulative statistical value. However, the present invention is not limited thereto, and the data processing circuit 220 may calculate the cumulative reference value based on the absolute reference value. In addition, the cumulative reference value may be a value set by a user.

The diagnosis circuit 230 may receive information about the cumulative statistical value and the cumulative reference value. The diagnosis circuit 230 may compare the cumulative statistical value with the cumulative reference value. The diagnosis circuit 230 may determine that an error has occurred in the battery cell B1 when the cumulative statistical value is equal to or greater than the cumulative reference value.

That is, the cumulative determination operation means a determination operation of performing a comparison operation using values (e.g., cumulative statistical value, cumulative reference value) obtained by accumulating and adding data values (e.g., statistical value, relative reference value) for the relative determination operation during a specific period, or performing a comparison operation using values (e.g., cumulative statistical value, cumulative reference value) obtained by accumulating and adding data values (e.g., statistical value, relative reference value) for the absolute determination operation during a specific period.

The data processing circuit 220 and the diagnosis circuit 230 may perform a first cumulative determination operation by accumulating the first statistical value of the battery cell B1, or perform a second cumulative determination operation by accumulating the second statistical value of the battery cell B1. In addition, the present invention is not limited thereto, and the data processing circuit 220 and the diagnosis circuit 230 may perform both the first cumulative determination operation and the second cumulative determination operation.

The diagnosis circuit 230 may repeatedly perform the absolute determination operation, the relative determination operation, and the cumulative determination operation. The diagnosis circuit 230 may count the number of times of absolute error in which it is determined that an error has occurred in the battery cell B1 in the absolute determination operation. The diagnosis circuit 230 may count the number of times of relative error in which it is determined that the error has occurred in the battery cell B1 in the relative determination operation. The diagnosis circuit 230 may count the number of times of cumulative error in which it is determined that the error has occurred in the battery cell B1 in the cumulative determination operation.

The diagnosis circuit 230 may finally determine whether or not the battery cell B1 is defective based on the number of times of absolute error, the number of times of relative error, and the number of times of cumulative error. For example, the diagnosis circuit 230 may determine that the battery cell B1 is defective when the number of times of absolute error, the number of times of relative error, and the number of times of cumulative error of the battery cell B1 are equal to or greater than the first number of times, the second number of times, and the third number of times, respectively. The first number of times, the second number of times, and the third number of times may be values set by the user. In addition, the first number of times, the second number of times, and the third number of times may be determined based on the number of times of absolute error, the number of times of relative error, and the number of times of cumulative error of the battery cells B1 to BN, respectively. For example, the first number of times may be the number of times of absolute error corresponding to the top 2% among the number of times of absolute error of the battery cells B1 to BN.

The memory 240 may store data necessary for the absolute determination operation, the relative determination operation, and the cumulative determination operation. In addition, the memory 240 may store data generated by the data processing circuit 220 and the diagnosis circuit 230. Specifically, the memory 240 may store data relating to the statistical value, the cumulative statistical value, the number of times of absolute error, the number of times of relative error, and the number of times of cumulative error. When it is determined that the battery cell B1 is defective, the memory 240 may store information about the battery cell B1, information about a defect occurring in the battery cell B1, etc.

Figure 3:
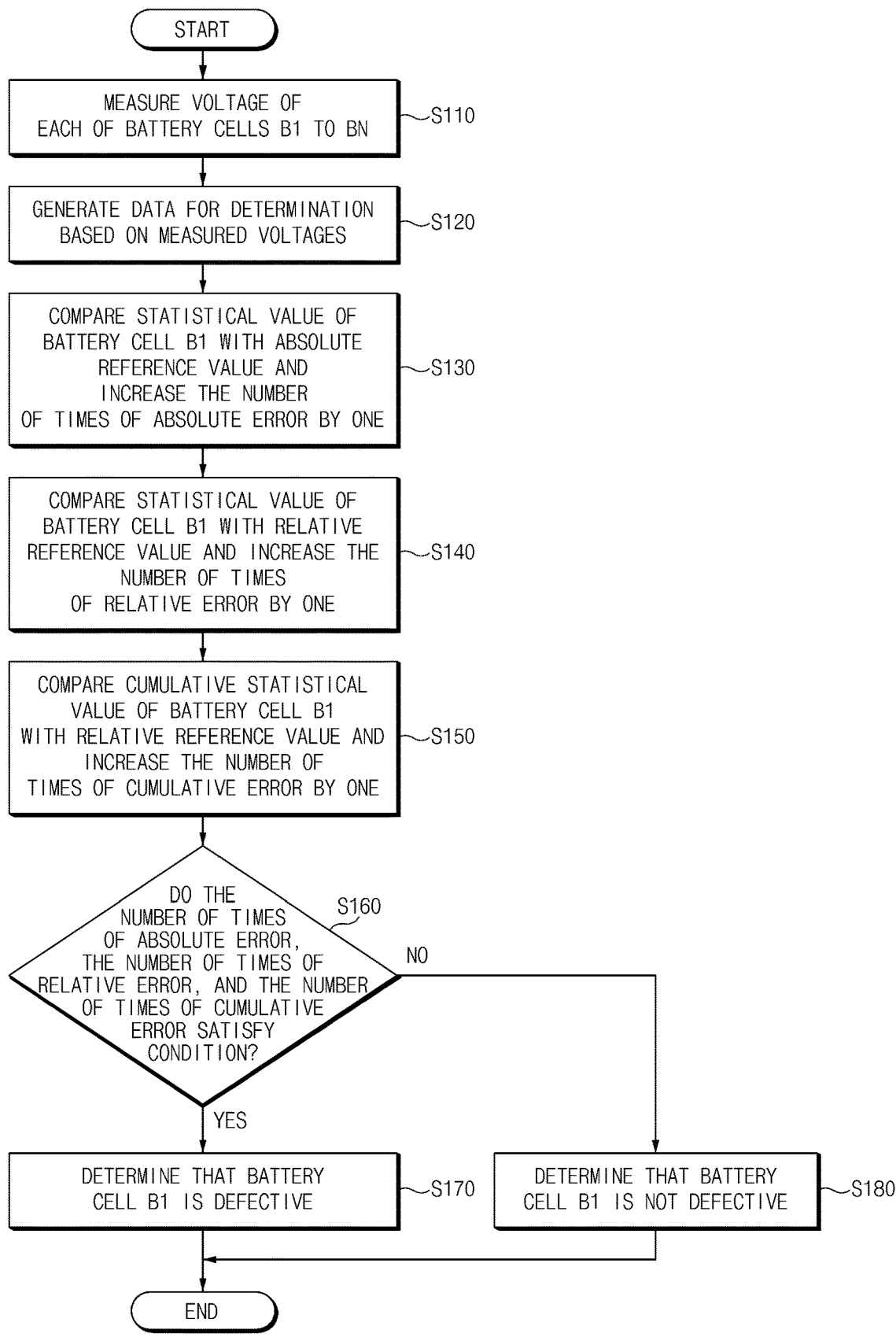
FIG. 3 is a flowchart for describing an operation of a battery management system of FIG. 2.

FIG. 3 is a flowchart for describing the operation of the battery management system of FIG. 2.

Referring to FIG. 3, a method for determining, by the battery management system 200, whether or not the battery cell B1 is defective through the absolute determination operation, the relative determination operation, and the cumulative determination operation by the battery management system 200 of FIG. 2 is described. In the description with reference to FIG. 3, the fact that the battery management system 200 performs the absolute determination operation means that it performs the first absolute determination operation and/or the second absolute determination operation. The fact that the battery management system 200 performs the relative determination operation means that it performs the first relative determination operation and/or the second relative determination operation. In addition, the fact that the battery management system 200 performs the cumulative determination operation means that it performs the first cumulative determination operation and/or the second cumulative determination operation.

In operation S110, the battery management system 200 may measure the voltage of each of the battery cells B1 to BN.

In operation S120, the battery management system 200 may generate data for the absolute determination operation, the relative determination operation, and the cumulative determination operation based on the measured voltages. Specifically, the battery management system 200 may calculate the statistical value, the cumulative statistical value, etc. of the battery cell B1 based on the measured voltages, and may calculate the relative reference value, the cumulative reference value, etc.

In operation S130, the battery management system 200 may perform the absolute determination operation. The battery management system 200 may compare the statistical value of the battery cell B1 with the absolute reference value. When the statistical value of the battery cell B1 is equal to or greater than the absolute reference value, the battery management system 200 may increase the number of times of absolute error by one.

In operation S140, the battery management system 200 may perform the relative determination operation. The battery management system 200 may compare the statistical value of the battery cell B1 with the relative reference value. When the statistical value of the battery cell B1 is equal to or greater than the relative reference value, the battery management system 200 may increase the number of times of relative error by one.

In operation S150, the battery management system 200 may perform the cumulative determination operation. The battery management system 200 may compare the cumulative statistical value of the battery cell B1 with the relative reference value. When the accumulated statistical value of the battery cell B1 is equal to or greater than the cumulative reference value, the battery management system 200 may increase the number of times of cumulative error by one.

In operation S160, the battery management system 200 may determine whether or not the number of times of absolute error, the number of times of relative error, and the number of times of cumulative error satisfy a condition. As described with reference to FIG. 2, the condition may be to determine whether or not the number of times of absolute error, the number of times of relative error, and the number of accumulated errors are equal to or greater than the first number of times, the second number of times, and the third number of times, respectively. Satisfying the condition may mean that the numbers of errors (e.g., the number of times of absolute error, the number of times of relative error, and the number of accumulated errors) should be respectively equal to or greater than the corresponding numbers of times (e.g., the first number of times, the second number of times, and the third number of times), but is not limited thereto. Satisfying the condition may be sufficient when at least one of (e.g., the number of times of cumulative error) the numbers of errors is equal to or greater than the corresponding number of times (e.g., the third number of times). Alternatively, satisfying the condition may mean that the sum of some of the numbers of errors (e.g. the sum of the number of times of absolute error and the number of times of relative error) is equal to or greater than the sum of the corresponding numbers of times (sum of the first number of times and the second number of times), and the remainder of the numbers of errors (e.g., the number of times of cumulative error) among the numbers of errors is equal to or greater than the corresponding number of times (e.g., the third number of times). In addition, the condition may be variously modified from comparing the numbers of errors with the corresponding numbers of times.

When the number of times of absolute error, the number of times of relative error, and the number of times of cumulative error satisfy the above conditions, operation S170 is performed. In operation S170, the battery management system 200 may finally determine that the battery cell B1 is defective.

When the number of times of absolute error, the number of times of relative error, and the number of times of cumulative error do not satisfy the above condition, operation S180 is performed. In operation S180, the battery management system 200 may finally determine that the battery cell B1 is not defective.

Figure 4:
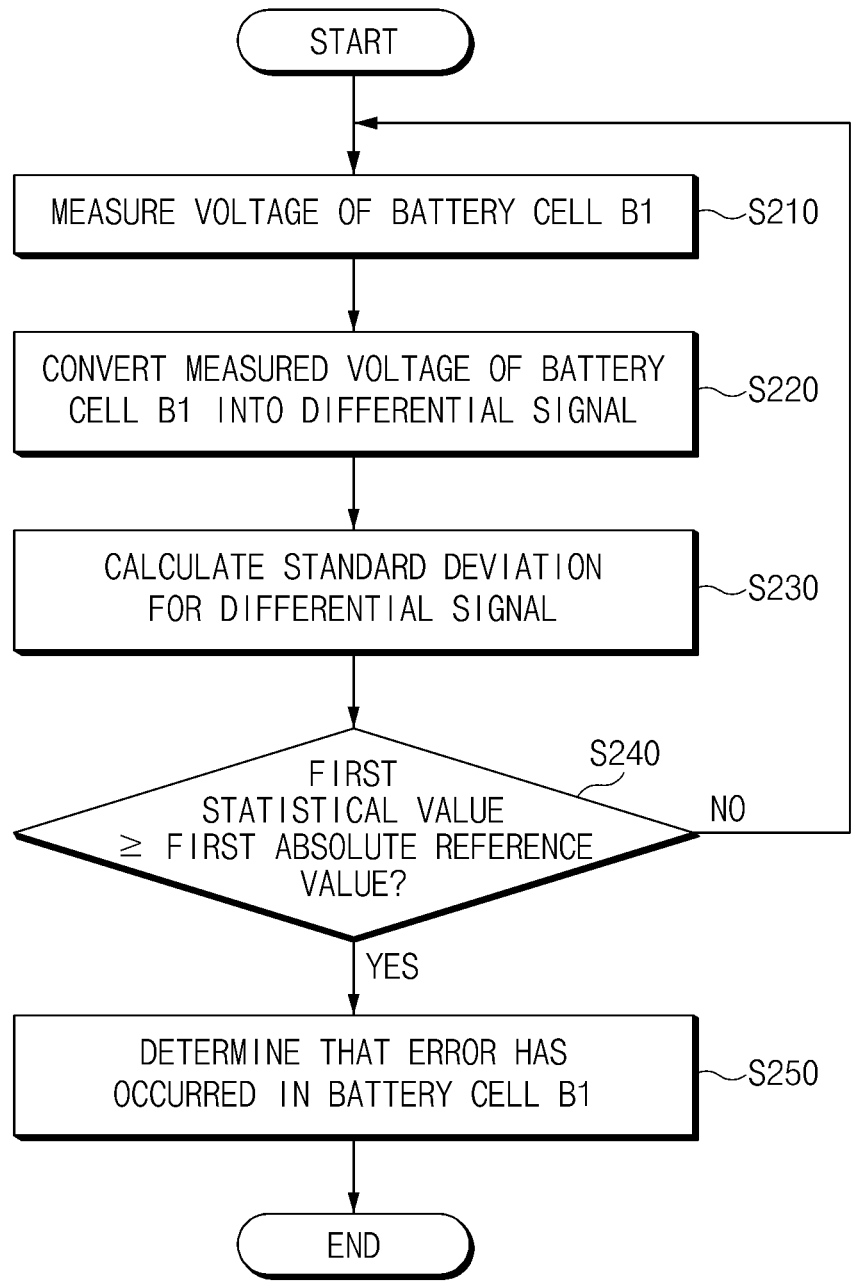
FIG. 4 is a flowchart for describing a first absolute determination operation of the battery management system of FIG. 2.

FIG. 4 is a flowchart for describing the first absolute determination operation of the battery management system of FIG. 2. The battery management system 200 of FIG. 2 may perform the first absolute determination operation in the charging section and the discharging section.

In operation S210, the voltage measurement circuit 210 may measure the voltage of the battery cell B1.

In operation S220, the data processing circuit 220 may convert the voltage of the battery cell B1 measured by the voltage measurement circuit 210 into a differential signal. In this case, the data processing circuit 220 may calculate a differential signal (e.g., dQ/dV) with respect to the capacitance and voltage of the battery cell B1. In order to calculate the differential signal, the battery management system 200 may measure the capacitance of the battery cell B1.

In addition, the data processing circuit 220 may convert the voltage of the battery cell B1 into a differential signal for a region in which the voltage is 4V to 4.2V. This is because unstable voltage profile due to internal short-circuit inside the battery can be detected in a high voltage region where the voltage of the battery cell B1 is 4V to 4.2V and the influence differential peak change due to other factors such as deviation or degradation between battery cells (B1) can be excluded. However, the differential signal converted by the data processing circuit 220 according to an embodiment of the present invention is not necessarily limited to a voltage range of 4V to 4.2V, and in addition, it may be converted into a differential signal with respect to any voltage range.

The data processing circuit 220 may perform preprocessing on voltage data of the battery cell B1 before calculating the differential signal, thereby converting the voltage of the battery cell B1 to be differentiable in a predetermined section. The preprocessing operation of the data processing circuit 220 will be described in detail with reference to FIG. 5.

In operation S230, the data processing circuit 220 may calculate the first statistical value with respect to the converted differential signal. In this case, the first statistical value of the differential signal calculated by the data processing circuit 220 is for determining abnormal behavior of the battery in a sliding window (or moving window) method, as will be described later. For example, the first statistical value for the differential signal may include a standard deviation.

In operation S240, the diagnosis circuit 230 may diagnose the battery cell B1 based on the differential signal converted by the data processing circuit 220.

When the first statistical value with respect to the differential signal of the battery voltage is equal to or greater than the first absolute reference value, operation S250 is performed. In operation S250, the diagnosis circuit 230 may determine that an error has occurred in the battery cell B1. The diagnosis circuit 230 may diagnose the battery cell B1 in the sliding window method with respect to the first statistical value of the differential signal relating to the battery voltage. As described above, when the diagnosis circuit 230 diagnoses the battery cell B1 in the sliding window method, the size of the window may be arbitrarily set by the user. When the first statistical value for the differential signal of the battery voltage is less than the first absolute reference value, operations S210 to S540 are performed again.

Figure 5:
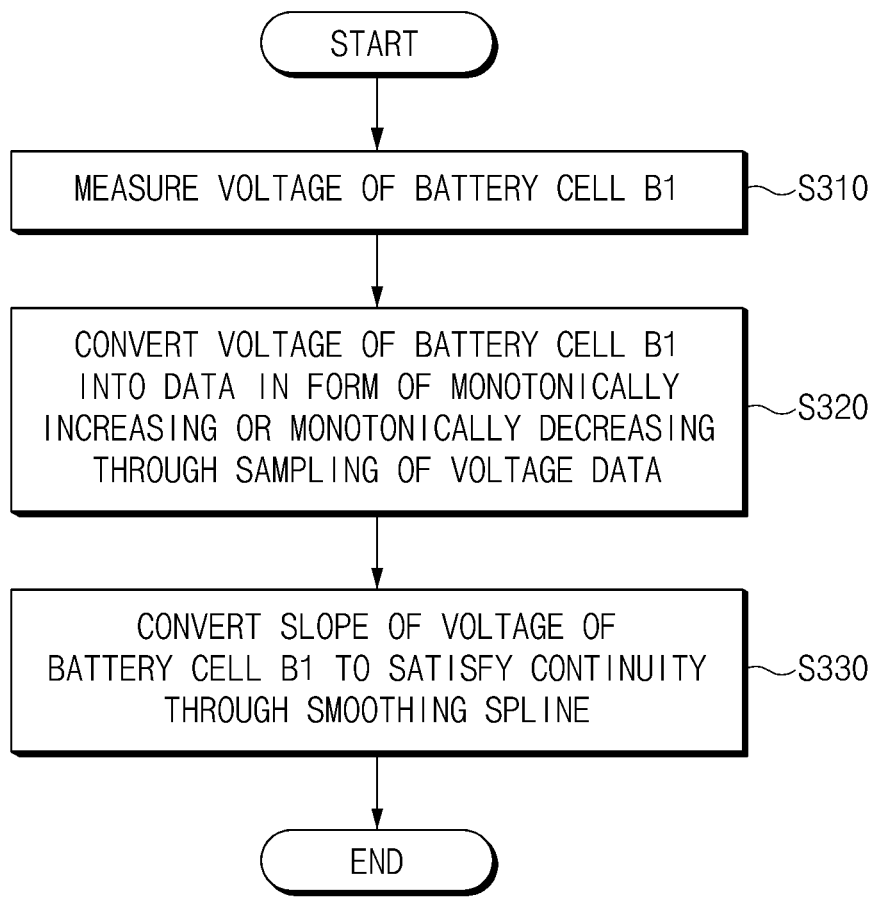
FIG. 5 is a flowchart for describing a data preprocessing operation of a data processing circuit of FIG. 2.

FIG. 5 is a flowchart for describing the data preprocessing operation of the data processing circuit of FIG. 2. The data processing circuit 220 of FIG. 2 may perform the data preprocessing operation to calculate the first statistical value.

In operation S310, the voltage measurement circuit 210 may measure the voltage of the battery cell B1.

The data processing circuit 220 may perform preprocessing on voltage data of the battery cell B1 before calculating the differential signal, thereby converting the voltage of the battery cell B1 to be differentiable in a predetermined section. In general, there may occur cases in which differential analysis of measured voltage data of the battery is impossible due to redundant signals, discontinuous sections, etc. Accordingly, the data processing circuit 220 may perform preprocessing the voltage data of the battery cell B1 before the conversion of the differential signal, thereby converting the voltage of the battery cell B1 to be differentiable in the predetermined section.

In operation S320, the data processing circuit 220 may convert the voltage of the battery cell B1 into data in the form of monotonically increasing or monotonically decreasing through sampling of the voltage data. For example, the data processing circuit 220 may perform voltage sampling by classifying capacitance values of the battery cells B1 having the same voltage magnitude and calculating an average value of the capacitance values of the battery cells B1 for each voltage magnitude.

In operation S330, the data processing circuit 220 may convert to satisfy continuity between adjacent data through the smoothing spline. Through this, a curve of the slope of the voltage data of the battery cell B1 may be converted into a gentle form.

Figure 6A:
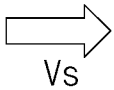
FIG. 6A is a diagram illustrating a method of performing sampling in order to remove redundant signals of battery voltage data.

FIG. 6A is a diagram illustrating a method of performing sampling to remove redundant signals of the battery voltage data.

Referring to FIG. 6A, measured data of voltage and capacitance of the battery for each time are illustrated. Here, the voltage is the same as 3.23V in the sections in which the battery capacitances are 43 Ah, 44 Ah, and 46 Ah, and the voltage is the same as 3.24V in the sections in which the battery capacitances are 45 Ah and 47 Ah. Accordingly, a redundant signal of voltage data may be generated, making differential analysis impossible.

In this case, the battery voltage data may be sampled by classifying the capacitance values of the battery for the capacitance and voltage data of the battery based on a voltage of a specific magnitude, and calculating the average value thereof. For example, as illustrated in FIG. 6A, the average value of capacitance values corresponding to each voltage may be calculated based on 3.23V and 3.24V, which are overlapping battery voltages. For example, when the voltage is 3.23V, 44.3 Ah, which is the average value of the battery capacitances 43 Ah, 44 Ah, and 46 Ah, may be determined as the capacitance value, and when the voltage is 3.24V, 46 Ah, which is the average value of the battery capacitances 45 Ah and 47 Ah, may be determined as the capacitance value.

As described above, the apparatus for diagnosing a battery according to an embodiment of the present invention may convert the voltage data into the monotonically increasing (or monotonically decreasing) form based on the measured voltage by performing sampling through the method illustrated in FIG. 6A.

Figure 6B:
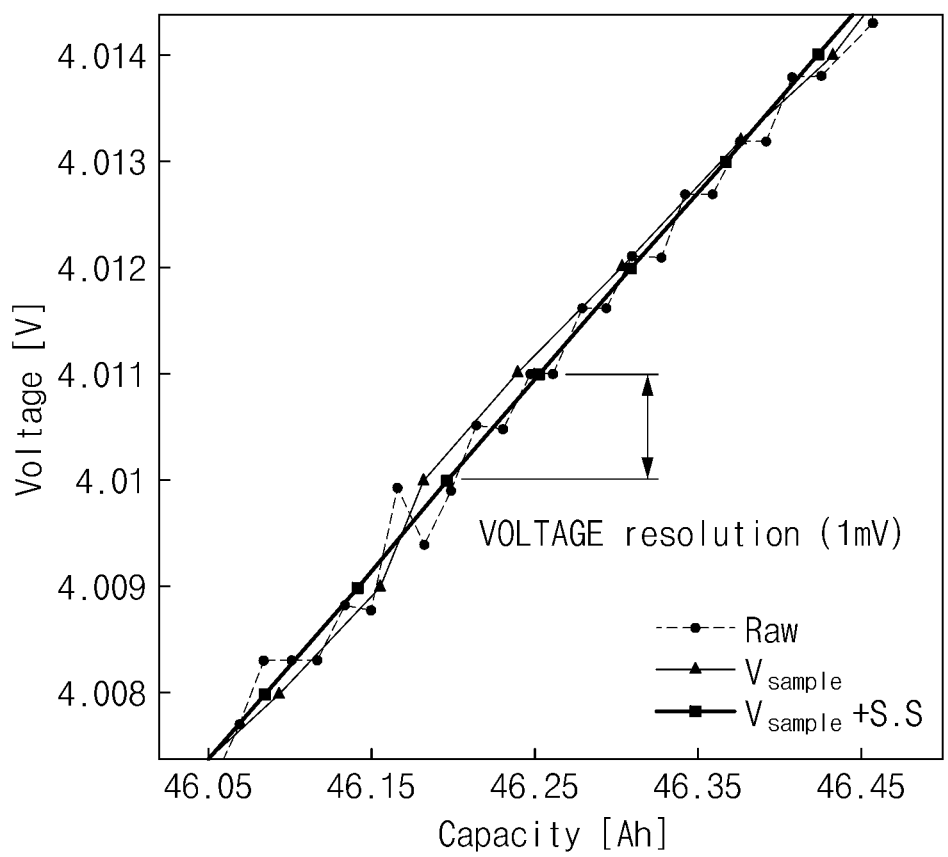
FIG. 6B is a graph illustrating the results obtained by performing preprocessing on the battery voltage data through sampling and a smoothing spline.
Figure 6C:
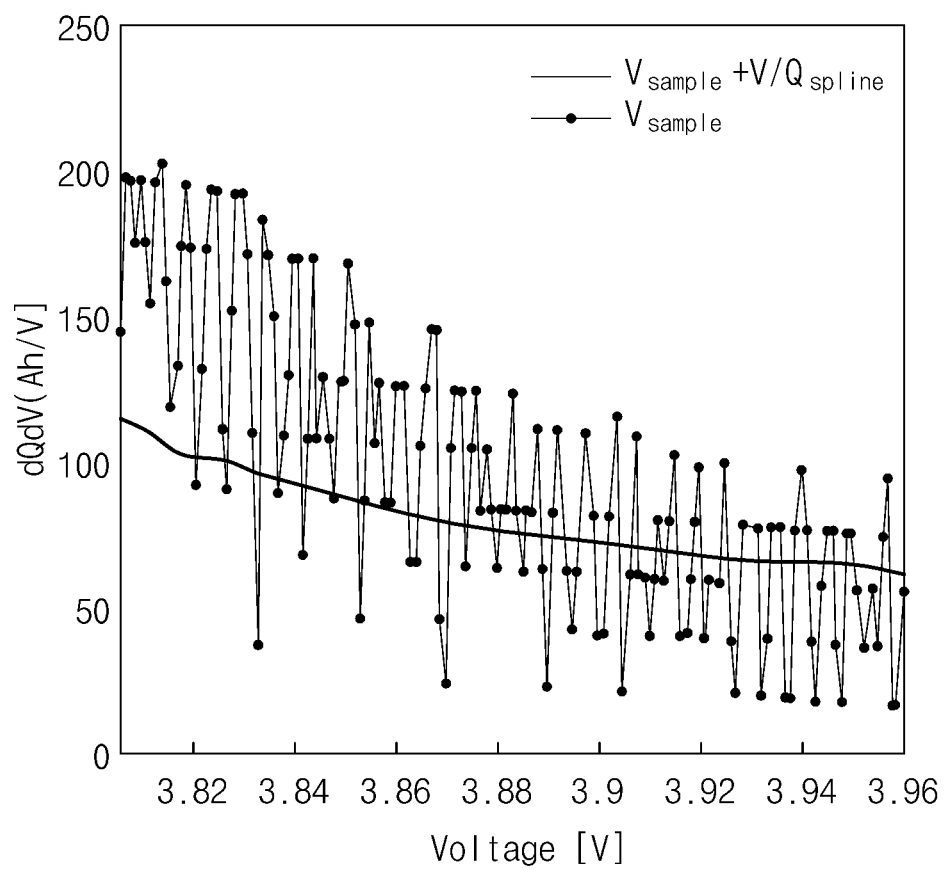
FIG. 6C is a graph illustrating a differential profile of the battery voltage data for each step of preprocessing.

FIG. 6B is a graph illustrating the results of performing preprocessing on the battery voltage data through sampling and a smoothing spline, and FIG. 6C is a graph illustrating the differential profile of the battery voltage data for each preprocessing step. In this case, the horizontal axis of FIG. 6B represents capacitance (Ah) of the battery, and the vertical axis represents measured voltage (V) of the battery. In addition, the horizontal axis of FIG. 6C represents voltage (V) of the battery, and the vertical axis represents differential signal (Ah/V) relating to the capacitance and voltage of the battery.

As illustrated in FIG. 6B, redundant signals and noise are generated in the case of raw voltage data, but it can be seen that the voltage data sampled according to FIG. 6A appears in a monotonically increasing form.

On the other hand, even when sampling processing is performed on raw data of voltage, a section where differentiation is impossible may appear due to a difference in slope between adjacent data. In this regard, referring to FIG. 6C, when only the sampling processing is performed on the raw data of the voltage, it can be seen that the value of the differential signal does not appear completely.

Therefore, by performing smoothing spline on the sampled voltage data, the slope of the voltage data of the battery can be converted to satisfy the continuity.

For example, a calculation equation for the smoothing spline can be expressed as follows.

$$\sum_{i=1}^{n}\{Y_i - \hat{f}(x_i)\}^2 + \lambda \int \hat{f}''(x)^2 dx$$

Through the smoothing spline equation, the slope of the sampled voltage data can be prevented from changing rapidly and converted into a continuous curve. In this case, as a value of $\lambda$ increases, the curve becomes smoother. For example, the $\lambda$ values may be 0.001(V) and 0.01(Q), respectively.

Figure 6D:
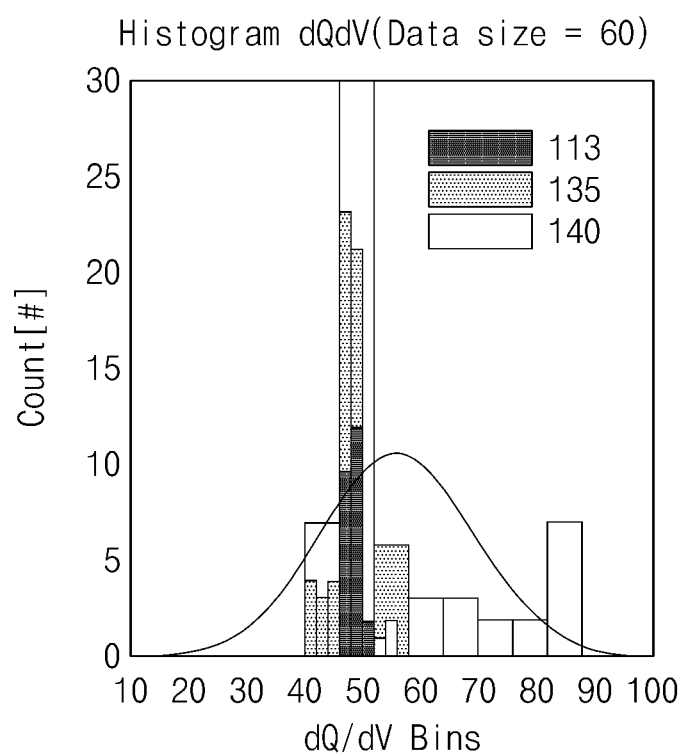
FIG. 6D illustrates a histogram of differential signals for each charging cycle of a battery.
Figure 6E:
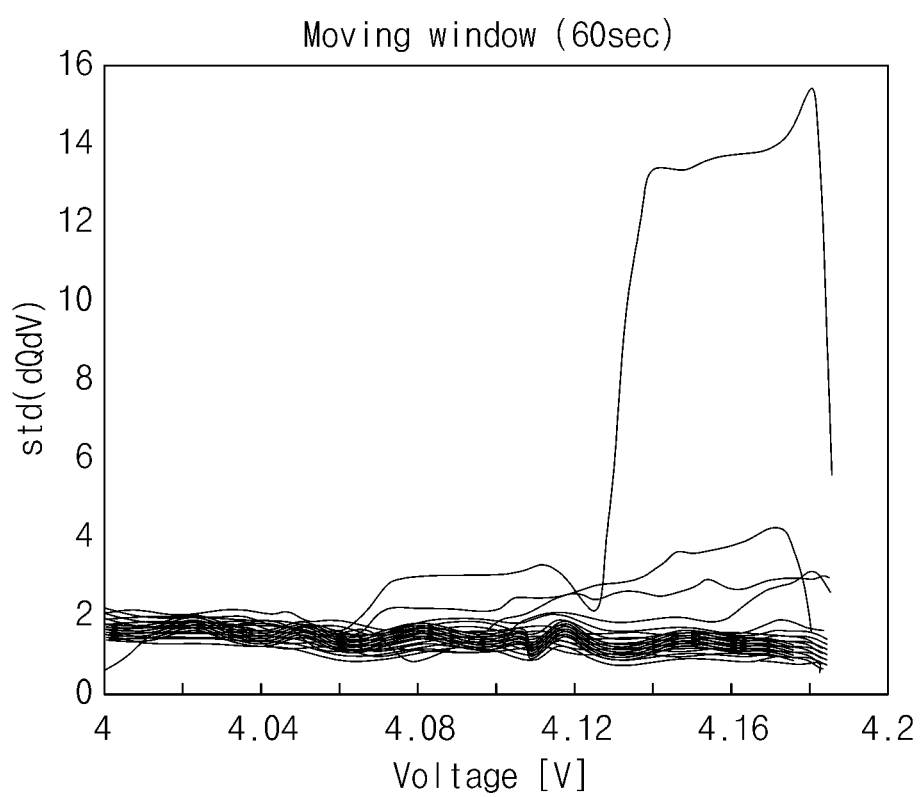
FIG. 6E illustrates is a graph illustrating a standard deviation for each charging cycle of the battery.

FIG. 6D illustrates a histogram of differential signals for each charging cycle of the battery, and FIG. 6E illustrates a standard deviation for each charging cycle of the battery. In this case, the horizontal axis of FIG. 6D represents bins of differential signal values, and the vertical axis represents the number of each differential signal value. In addition, the horizontal axis of FIG. 6D represents the voltage (V), and the vertical axis represents the standard deviation of the differential signal. Meanwhile, in the case of FIGS. 6D and 6E, the result obtained by setting the size of the moving (i.e., sliding) window to 60 is illustrated.

Referring to FIG. 6D, a histogram of differential signals for a case where the number of charge cycles are 113, 135, and 140, respectively. As illustrated in FIG. 6D, it can be seen that, when the charging cycle is 113, a normal charging profile is illustrated, but when the charging cycle is 135 and 140, it can be confirmed that an unstable open profile appears.

On the other hand, referring to FIG. 6E, when the standard deviation of the differential signal is uniform with respect to the voltage, it means that normal voltage behavior appears, and when the standard deviation of the differential signal sharply rises in a specific voltage section, it means that unstable behavior of the voltage occurs.

As described above, it is possible to detect whether or not the voltage is unstable through the change of the standard deviation within an analysis window of the differential signal with respect to the battery voltage. Accordingly, according to the apparatus for diagnosing a battery according to an embodiment of the present invention, it is possible to quantify a determination condition of normal behavior or abnormal behavior of the battery voltage.

Figure 6F:
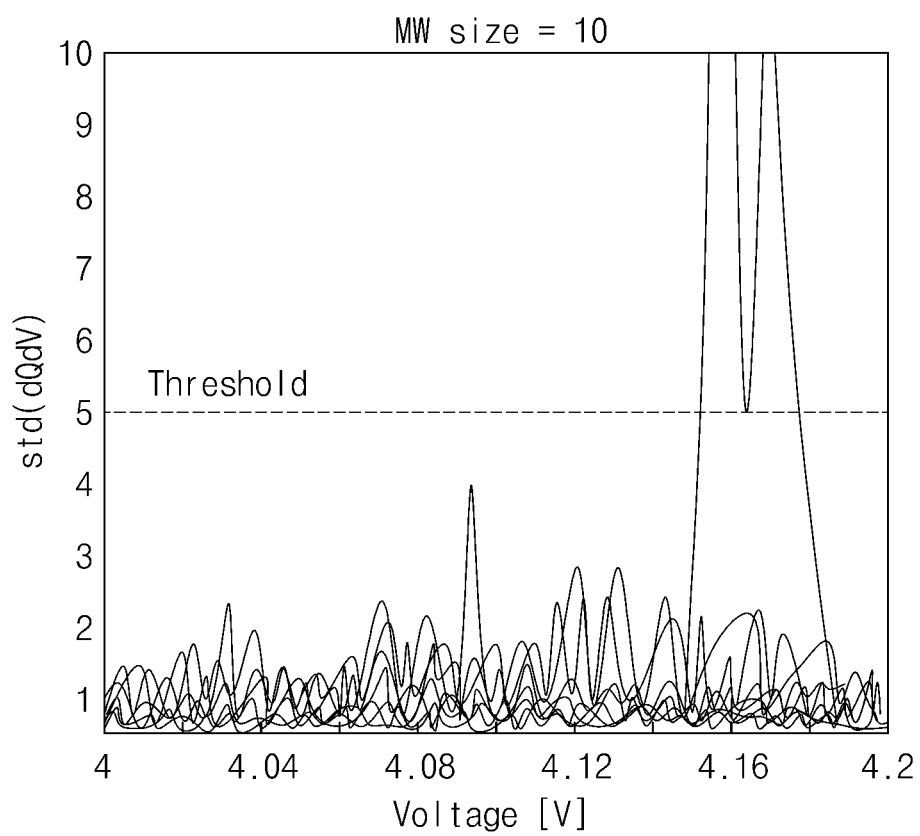
FIG. 6F is a graph illustratively describing an example of diagnosing an abnormality in a battery through a standard deviation of the differential signal in the apparatus for diagnosing the battery according to the embodiment of the present invention.

FIG. 6F is a diagram illustratively describing an example of diagnosing an abnormality in the battery through the standard deviation of the differential signal in the apparatus for diagnosing a battery according to an embodiment of the present invention. In this case, FIG. 6f illustrates the result derived by setting the size of the moving (sliding) window to 10, the horizontal axis represents the voltage (V), and the vertical axis represents the standard deviation of the differential signal.

As illustrated in FIG. 6F, the apparatus for diagnosing a battery according to an embodiment of the present invention may diagnose an abnormal voltage drop due to an internal short-circuit of the battery based on whether or not the standard deviation of the differential signal is equal to or greater than a preset reference value. For example, referring to FIG. 6F, it may be determined that the abnormal voltage drop occurs in a region where the battery voltage is 4.16 to 4.18V.

On the other hand, in the case of using the standard deviation of the differential signal as illustrated in FIG. 6F, as the size of the sliding window is smaller, the discrimination ability of unstable behavior increases, so that the voltage drop phenomenon can be more easily and accurately detected.

In addition, in the description as above, it has been described that the standard deviation of the differential signal of the battery voltage is used to determine whether or not it is normal, but the present invention is not limited thereto, and in addition to the standard deviation, various statistical values such as an average value, a median value, extraversion, and kurtosis for a differential signal may be used.

Figure 7:
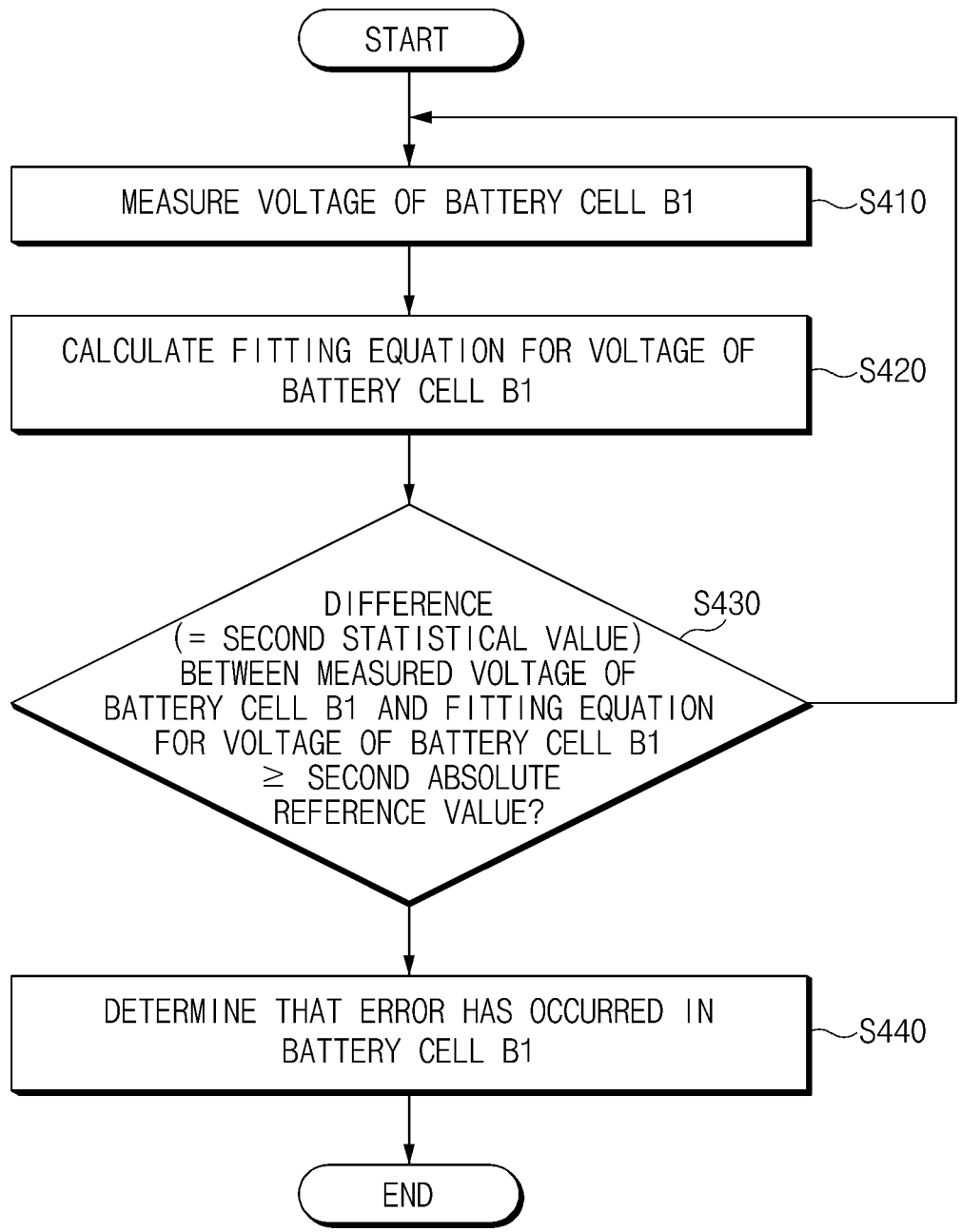
FIG. 7 is a flowchart for describing a second absolute determination operation of the battery management system of FIG. 2.

FIG. 7 is a flowchart for describing the second absolute determination operation of the battery management system of FIG. 2.

In operation S410, the voltage measurement circuit 210 may measure the voltage of the battery cell B1. In this case, the voltage measurement circuit 210 may measure the voltage of the battery cell B1 at predetermined time intervals.

In operation S420, the data processing circuit 220 may calculate a fitting equation for the voltage of the battery cell B1. In this case, the fitting equation calculated by the data processing circuit 220 may be a model voltage representing a voltage profile of the battery cell B1. For example, the fitting equation may be an exponential equation. In addition, the data processing circuit 220 may calculate the fitting equation by least square estimation. However, this is only an example, and the present invention is not limited thereto, and the data processing circuit 220 may calculate the fitting equation in various ways. The data processing circuit 220 may calculate the fitting equation for a voltage in a rest section in which the voltage drop phenomenon occurs due to an internal short-circuit of the battery occurs after charging of the battery cell B1 is completed. The second statistical value may be calculated based on the fitting equation for the voltage of the battery cell B1 calculated by the data processing circuit 220. The second statistical value may be a difference value between the measured voltage of the battery cell B1 and a voltage according to the fitting equation calculated by the data processing circuit 220.

In operation S430, the diagnosis circuit 230 may diagnose whether or not an error has occurred in the battery cell B1 based on the fitting equation for the voltage of the battery cell B1 calculated by the data processing circuit 220.

When the second statistical value is equal to or greater than the second absolute reference value, operation S440 is performed. In this case, the second absolute reference value may be set based on a predetermined measurement error value of the voltage measurement circuit 210. In operation S440, the diagnosis circuit 230 may determine that the error has occurred in the battery cell B1. When the second statistical value is less than the second absolute reference value, operations S410 to S430 are performed again.

Figure 8A:
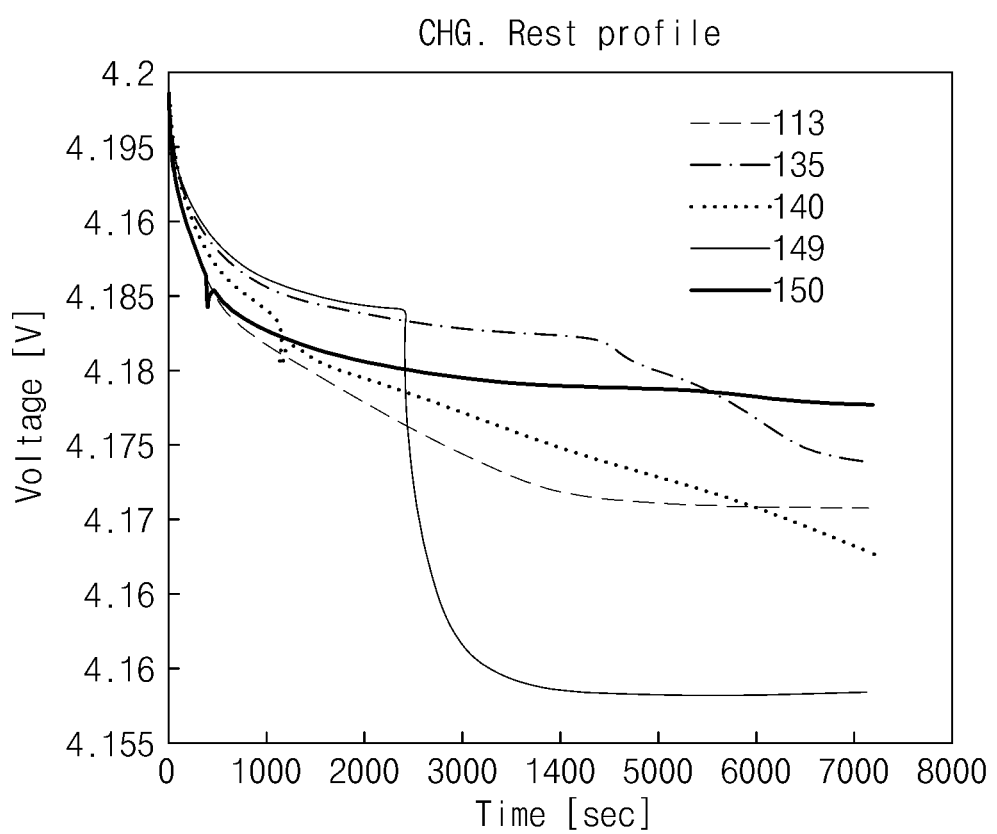
FIG. 8A illustrates a voltage change when a voltage drop due to an internal short-circuit of a battery cell occurs over the entire section.
Figure 8B:
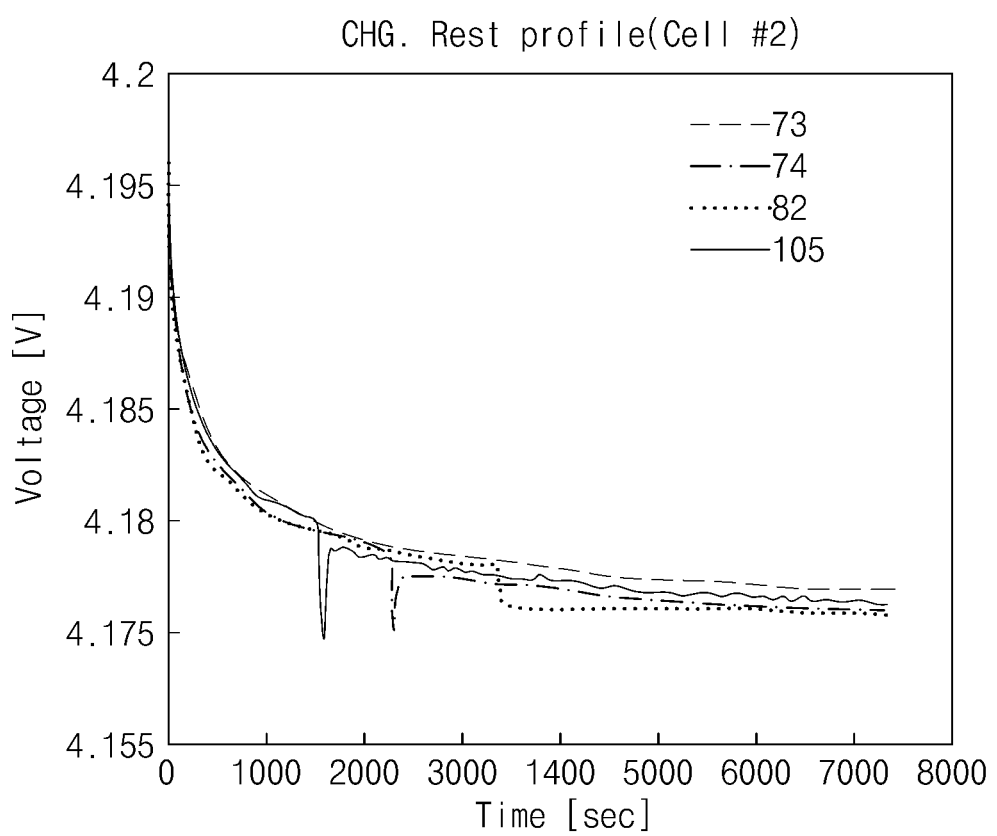
FIG. 8B is a diagram illustrating a voltage change when the voltage drop due to the internal short-circuit of the battery cell temporarily occurs.

FIG. 8A is a diagram illustrating a voltage change when the voltage drop due to the internal short-circuit of the battery cell occurs over the entire section, and FIG. 8B is a diagram illustrating a voltage change when the voltage drop due to the internal short-circuit of the battery cell temporarily occurs. Here, in FIGS. 8A and 8B, the horizontal axis represents the time (seconds), and the vertical axis represents the voltage (V) of the battery.

Referring to FIG. 8A, it can be seen that, for the case of 113, 135, 140, 149, and 150-th charging cycles, the voltage drop due to the internal short-circuit of the battery cell in the rest section after charging the battery gradually appears over the entire period.

In addition, referring to FIG. 8B, it can be seen that, for the case of 73, 74, 82, and 105-th charging cycles, the voltage drop due to the internal short-circuit of the battery cell in the rest section after charging the battery temporarily occurs in the section of about 1500 seconds, section of 2300 seconds, etc.

Figure 8C:
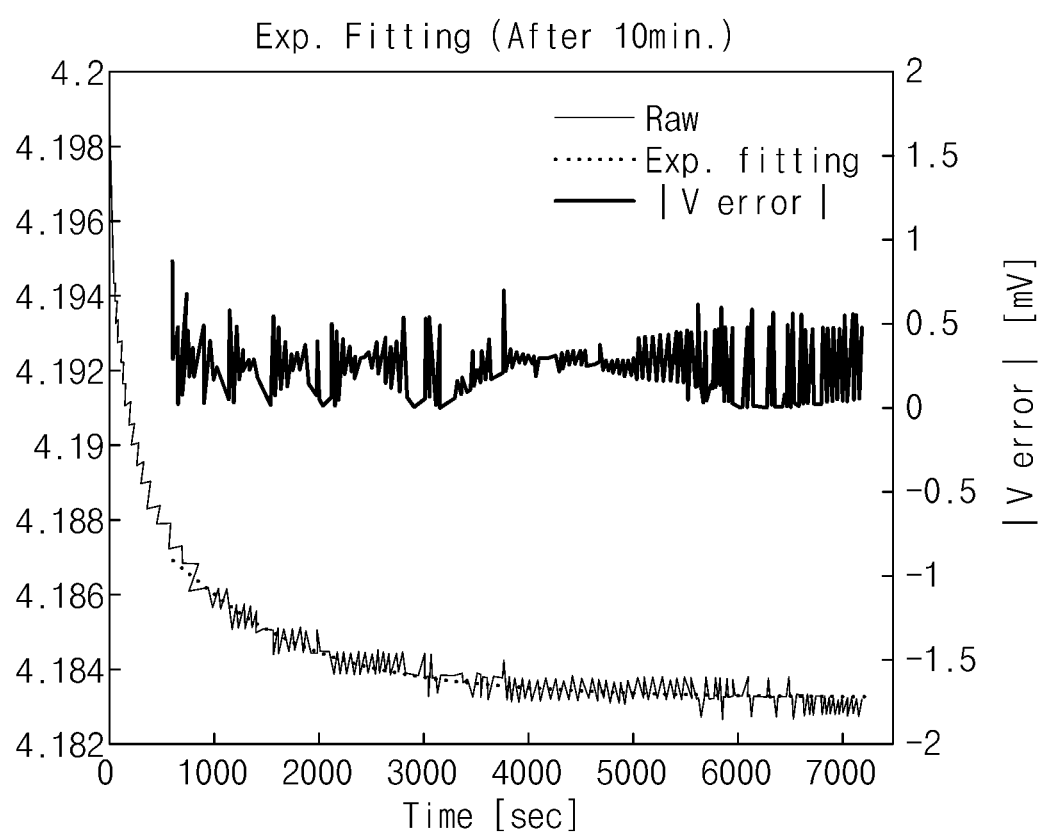
FIG. 8C is a graph illustrating an actual rest voltage for about 10 minutes after charging the battery, a voltage according to a fitting equation, and a difference value therebetween.

FIG. 8C is a graph illustrating an actual rest voltage for about 10 minutes after charging the battery, a voltage according to a fitting equation, and a difference value therebetween. In this case, the horizontal axis of FIG. 8C represents the time (i.e., seconds), the vertical axis (i.e., left) represents the voltage (V) of the battery, and the vertical axis (i.e., right) represents the absolute value (mV) of the difference between the actual measured voltage of the battery and the voltage according to the fitting equation. The fitting equation of the battery voltage in FIG. 8C is derived through the least square estimation. In this case, the fitting equation of the battery voltage can be expressed as follows.

$$y_{fit} = a \times \exp(b \cdot t) + c$$

In the apparatus for diagnosing a battery according to an embodiment of the present invention, the fitting equation of the battery voltage may be completed by calculating constants of a, b, and c in the above equation, respectively. However, the above equation is only illustrated as an example, the present invention is not limited thereto, and various equations capable of making the voltage of the battery fit may be used.

Referring to FIG. 8C, the absolute value of the difference between the actual measured rest voltage (raw) of the battery and the voltage (Exp. fitting) according to the fitting equation is indicated by $|V_{error}|$ in the center of the graph. As described above, the absolute value of the difference between the actual measured voltage of the battery and the voltage according to the fitting equation means the second statistical value. The apparatus for diagnosing the battery of the present invention may detect the voltage drop due to the internal short-circuit in the rest section of the battery by comparing the second statistical value with the second absolute reference value.

Figure 8D:
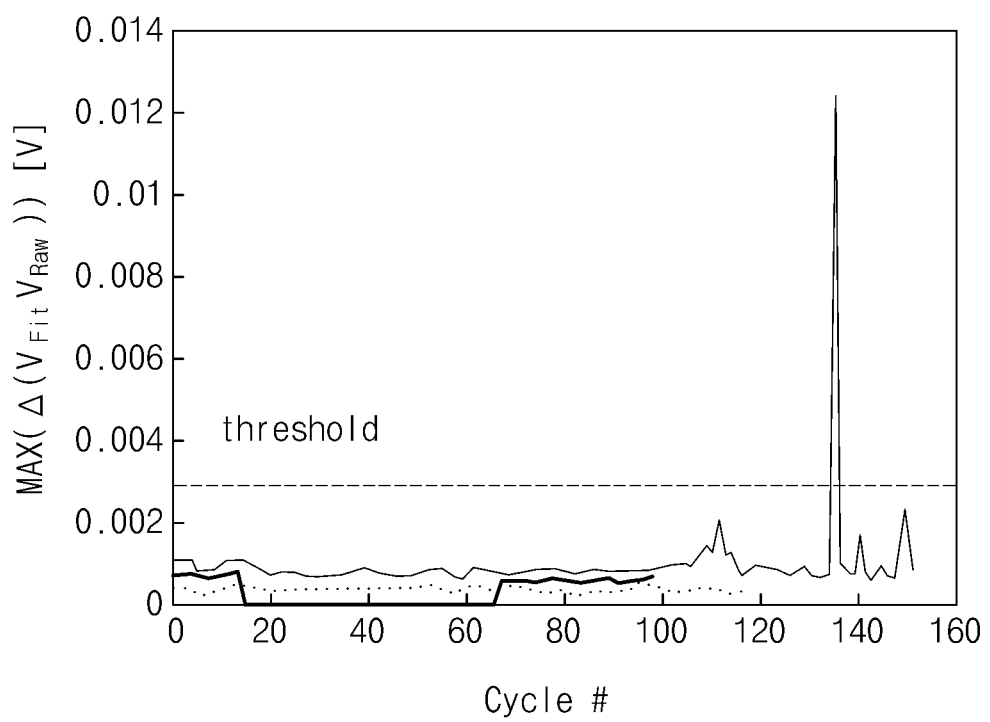
FIG. 8D illustrates a result of detecting, by the apparatus for diagnosing a battery according to an embodiment of the present invention, that the voltage drop due to the internal short-circuit of the battery cell occurs over the entire section.
Figure 8E:
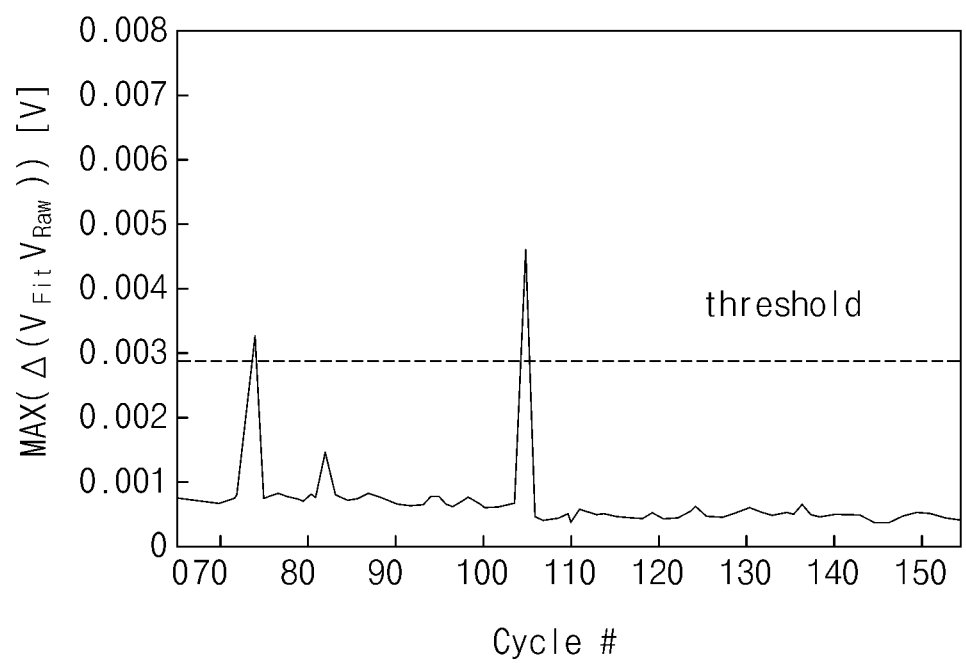
FIG. 8E illustrates a result of detecting that the voltage drop due to the internal short-circuit of the battery cell temporarily occurs.

FIG. 8D illustrates a result of detecting, by the apparatus for diagnosing a battery according to an embodiment of the present invention, that the voltage drop due to the internal short-circuit of the battery cell occurs over the entire section and FIG. 8E illustrates a result of detecting, by the apparatus for diagnosing a battery according to an embodiment of the present invention, that the voltage drop due to the internal short-circuit of the battery cell temporarily occurs.

In this case, the horizontal axes of FIGS. 8D and 8E represent the number of charging cycles of the battery, and the vertical axes thereof represent the maximum value (V) of the difference value between the actual measured voltage of the battery and the voltage according to the fitting equation.

Referring to FIG. 8D, the apparatus for diagnosing a battery may compare the second statistical value with a second absolute reference value when the voltage drop due to the internal short-circuit of the battery cell occurs over the entire section, and may determine that the voltage drop due to the internal short-circuit of the battery has occurred when the second statistical value is equal to or greater than the second absolute reference value.

Similarly, referring to FIG. 8E, the apparatus for diagnosing a battery may compare the second statistical value with the second absolute reference value even when the voltage drop due to the internal short-circuit of the battery cell temporarily occurs, and may determine that the voltage drop due to the internal short-circuit of the battery has occurred when the second statistical value is equal to or greater than the second absolute reference value. In this case, the reference values of FIGS. 8D and 8E may be determined based on a measurement range of the voltage sensor itself.

Figure 9:
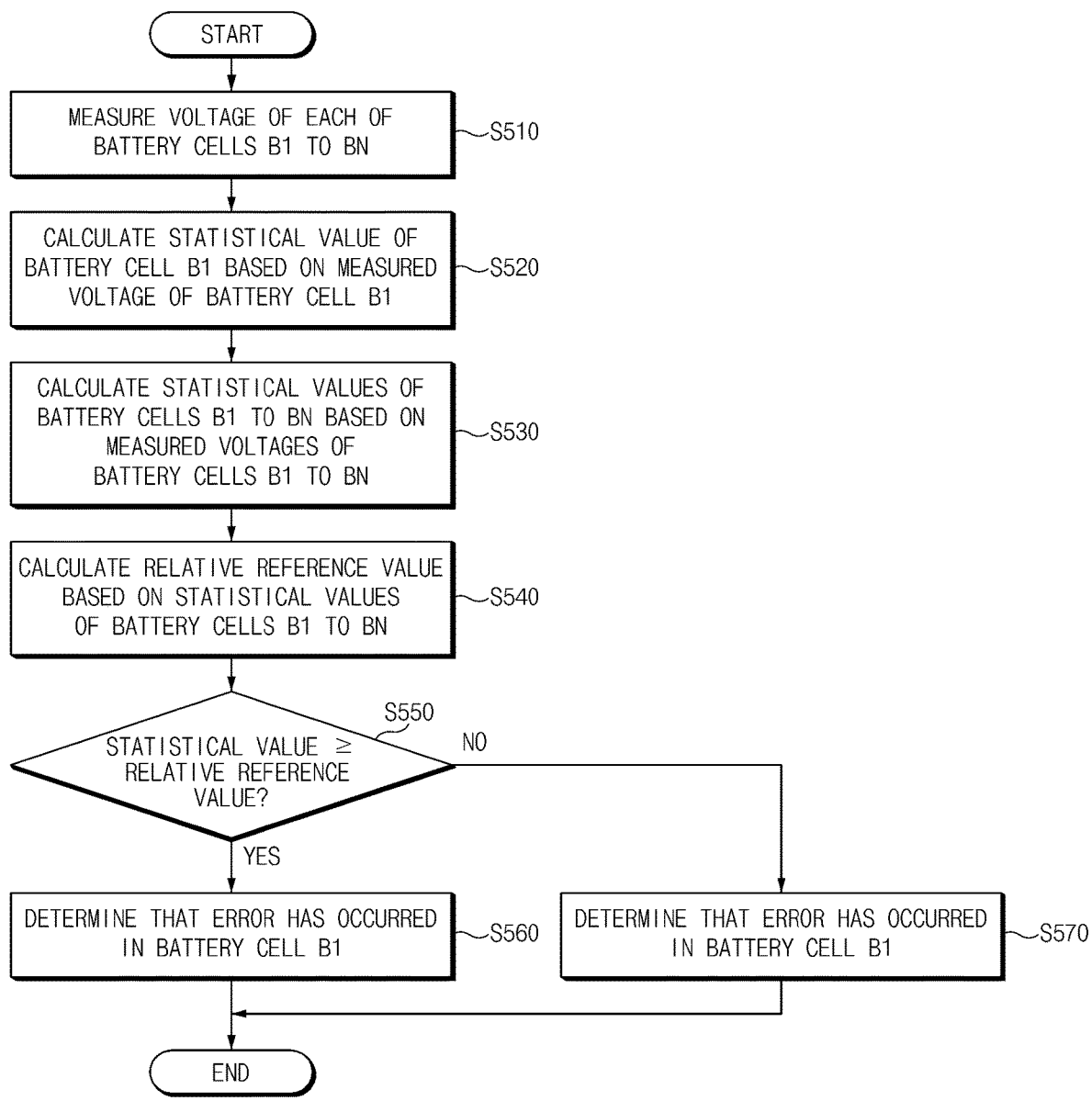
FIG. 9 is a flowchart for describing a relative determination operation of the battery management system of FIG. 2.

FIG. 9 is a flowchart for describing the relative determination operation of the battery management system of FIG. 2. In a method corresponding to the relative determination operation described with reference to FIG. 9, the first relative determination operation and the second relative determination operation may be performed.

In operation S510, the voltage measurement circuit 210 may measure the voltage of each of the battery cells B1 to BN. In this case, the voltage measurement circuit 210 may measure the voltages of the battery cells B1 to BN at predetermined time intervals.

In operation S520, the data processing circuit 220 may calculate the statistical value of the battery cell B1 based on the measured voltage of the battery cell B1. The statistical value is an index value indicating a voltage state of the battery cell B1 and may be calculated in various ways. For example, in the first relative determination operation, the data processing circuit 220 may calculate a standard deviation for the differential signal of the voltage of the battery cell B1. When the voltage of the battery cell B1 is measured several times at predetermined time intervals, the data processing circuit 220 may calculate the standard deviation of the differential signal of the voltage of the battery cell B1 in each time section. In this case, the first statistical value may be the maximum value among the calculated standard deviations.

In operation S530, the data processing circuit 220 may calculate the statistical values of the battery cells B1 to BN based on the measured voltages of the battery cells B1 to BN. The statistical values of the battery cells B1 to BN may also be calculated substantially the same manner as described with reference to operation S520.

In operation S540, the data processing circuit 220 may calculate a relative reference value based on the statistical values of the battery cells B1 to BN. The relative reference value may be an 'n' sigma value of the statistical values of the battery cells B1 to BN. Here, 'n' may be a positive number.

In operation S550, the diagnosis circuit 230 may compare the statistical value of the battery cell B1 with the relative reference value.

When the statistical value of the battery cell B1 is greater than or equal to the relative reference value, operation S560 is performed. In operation S560, the diagnosis circuit 230 may determine that an error has occurred in the battery cell B1. When the statistical value of the battery cell B1 is less than the relative reference value, operation S570 is performed. In operation S570, the diagnosis circuit 230 may determine that the error has not occurred in the battery cell B1

Figure 10A:
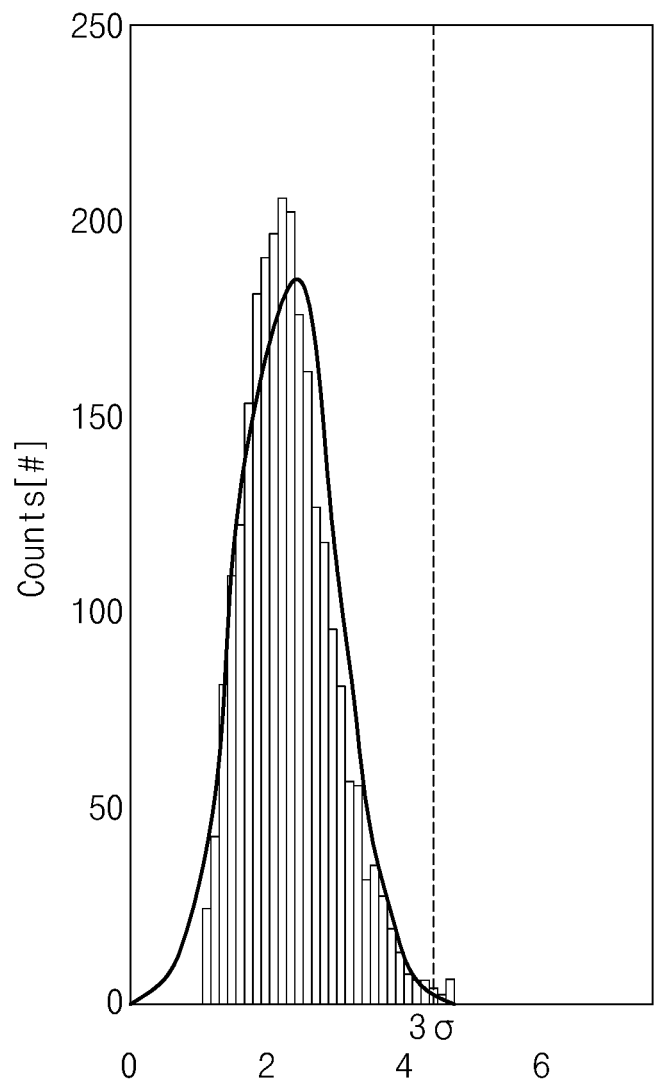
FIG. 10A is a graph illustrating a distribution of first statistical values of battery cells.

FIG. 10A is a graph illustrating the distribution of first statistical values of battery cells.

The horizontal axis of FIG. 10A represents the first statistical value, and the vertical axis represents the number of battery cells. The first statistical value of any battery cell described with reference to FIG. 10A means the maximum value (max(std(dQ/dV))) among standard deviations of values obtained by differentiating the voltage of the battery cell.

When the relative reference value is determined to be a 3 sigma value of statistical values of the battery cells B1 to BN, it may be determined that an error has occurred in battery cells included on the right side of the 3-sigma value in the graph of FIG. 10A.

Figure 10B:
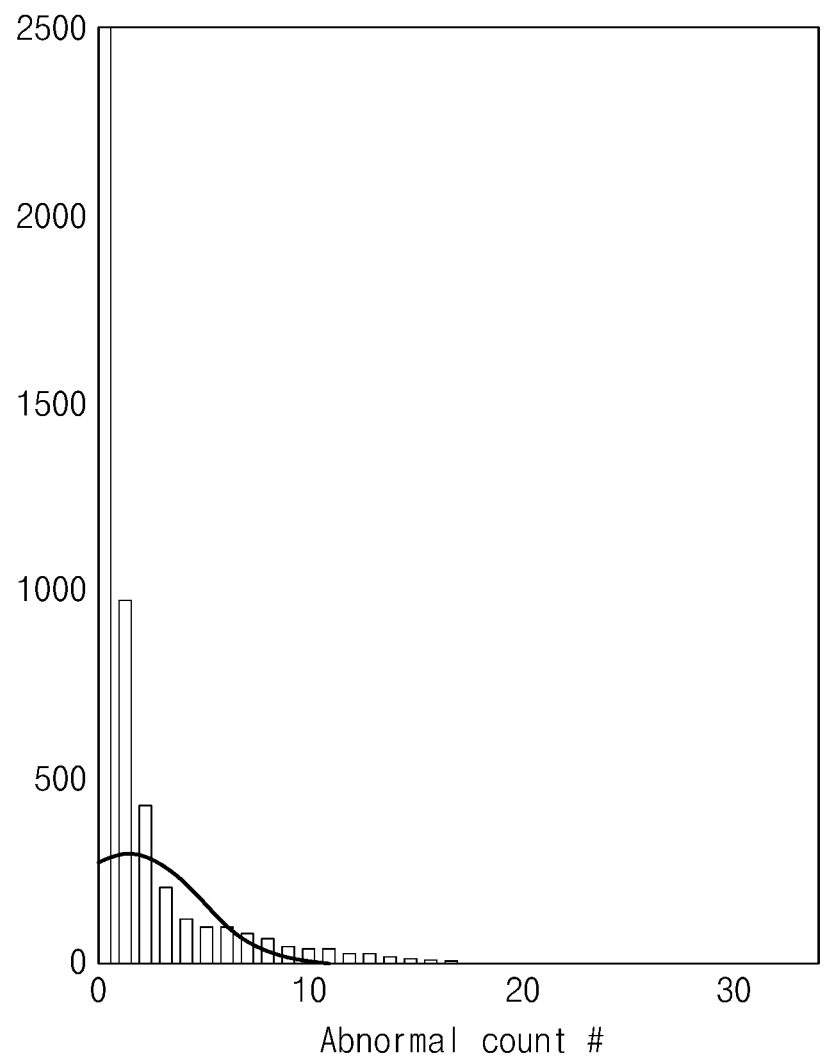
FIG. 10B is a graph illustrating the number of times of relative error of battery cells.

FIG. 10B is a graph illustrating the number of times of relative error of battery cells.

The horizontal axis of FIG. 10B represents the number of times of relative error of the battery cells, and the vertical axis represents the number of battery cells. The diagnosis circuit 230 may perform the relative determination operation at predetermined time intervals. The diagnosis circuit 230 may accumulate the number of times of relative error of the battery cells while performing the relative determination operation. The greater the number of times of relative error of the battery cell, the higher the probability that the battery cell is determined to be defective.

Figure 11:
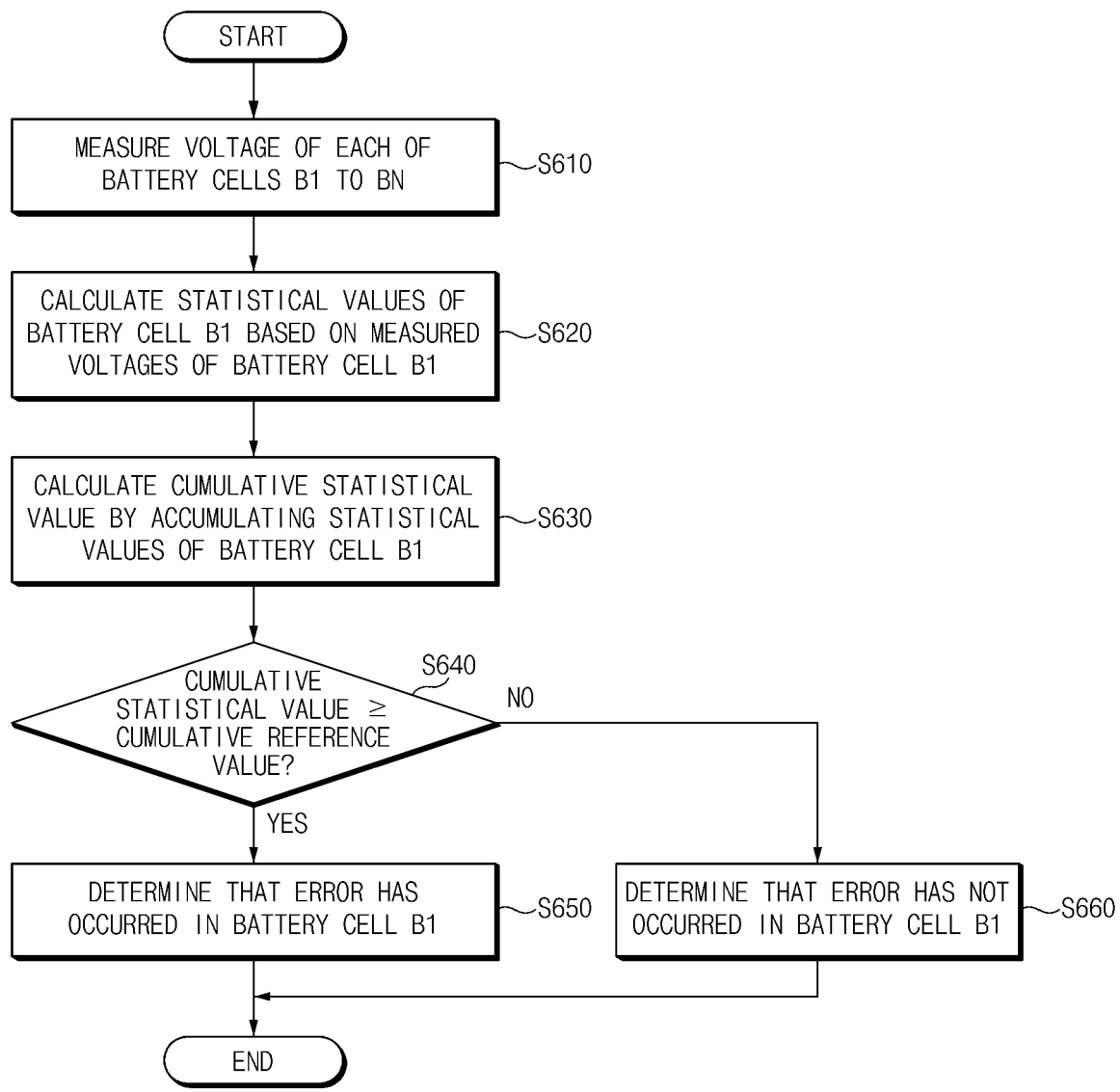
FIG. 11 is a flowchart for describing a cumulative determination operation of the battery management system of FIG. 2.

FIG. 11 is a flowchart for describing the cumulative determination operation of the battery management system of FIG. 2. In a method corresponding to the cumulative determination operation described with reference to FIG. 11, the first cumulative determination operation and the second cumulative determination operation may be performed.

In operation S610, the voltage measurement circuit 210 may measure the voltage of the battery cell B1 at predetermined time intervals.

In operation S620, the data processing circuit 220 may calculate the statistical values of the battery cell B1 based on the voltages of the battery cell B1 measured at predetermined time intervals.

In operation S630, the data processing circuit 220 may calculate a cumulative statistical value by accumulating the statistical values of the battery cell B1. The data processing circuit 220 may select some of the statistical values calculated during the analysis period, and may calculate the cumulative statistical value by accumulating the selected statistical values.

In operation S640, the diagnosis circuit 230 may compare the cumulative statistical value with the cumulative reference value. The cumulative reference value may be a value calculated by accumulating the relative reference values, a value set by a user, or a value set based on the state of the battery cell.

When the cumulative statistical value is equal to or greater than the cumulative reference value, operation S650 is performed. In operation S650, the diagnosis circuit 230 may determine that an error has occurred in the battery cell B1. When the cumulative statistical value is less than the cumulative reference value, operation S660 is performed. In operation S660, the diagnosis circuit 230 may determine that the error has not occurred in the battery cell B1.

As described above, the apparatus for diagnosing a battery of the present invention can finally determine whether or not the battery cell is defective by comprehensively considering the results of the absolute determination operation, the relative determination operation, and the cumulative determination operation. Accordingly, according to the present invention, accuracy of determining a defect in a battery cell may be increased. In addition, in the present invention, the operation of diagnosing an error of the battery cell occurring in the charging section and the discharging section and the operation of diagnosing the error of the battery cell occurring in the rest section may be performed, and the diagnostic operations described above may be selectively performed according to a situation.

Figure 12:
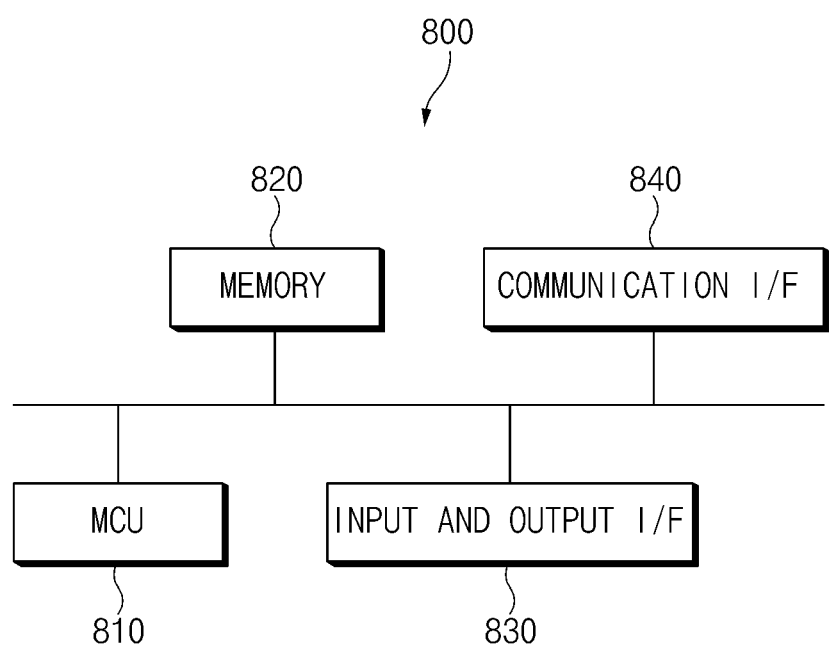
FIG. 12 is a diagram illustrating a hardware configuration of the apparatus for diagnosing a battery according to an embodiment of the present invention.

FIG. 12 is a diagram illustrating a hardware configuration of the apparatus for diagnosing a battery according to an embodiment of the present invention.

Referring to FIG. 12, the apparatus for diagnosing a battery 800 includes a microcontroller (MCU) 810 for controlling various processes and each configuration, a memory 820 in which an operating system program and various programs (e.g., a battery diagnosis program, a voltage approximation calculation program, etc.) are recorded, an input/output interface 830 that provides an input interface and an output interface between the battery cell module and/or the semiconductor switching element, and a communication interface 840 capable of communicating with the outside through a wired or wireless communication network. In this way, the computer program according to the present invention may be implemented as a module, that performs, for example, each of the functional blocks illustrated in FIG. 2, by being recorded in the memory 820 and processed by the microcontroller 810.

The matters described above are specific embodiments for embodying the present invention. The present invention will include not only the embodiments described above, but also embodiments to which simple design change is made or which are easily changeable. In addition, the present invention will include techniques that can be easily modified and embodied using the embodiments. Therefore, the scope of the present invention should not be limited to the embodiments described above, but should be defined by the claims described below as well as the claims and equivalents of the present invention.

The invention claimed is:

1. An apparatus for diagnosing a battery, the apparatus comprising:
a voltage measurement circuit configured to measure a voltage of a battery cell of the battery;
a data processing circuit configured to:
calculate a target statistical value indicating a state of the battery cell based on a voltage measured by the voltage measurement circuit, and
calculate a cumulative statistical value by accumulating target statistical values of the battery cell during an analysis period; and
a diagnosis circuit configured to determine whether or not an error has occurred in the battery cell through a cumulative determination operation of comparing the cumulative statistical value with a cumulative reference value, and count a number of times of cumulative error when it is determined that the error has occurred in the battery cell in the cumulative determination operation,
wherein the apparatus is configured to control the battery based on the cumulative determination operation performed by the diagnosis circuit.

2. The apparatus of claim 1, wherein:
the data processing circuit is further configured to calculate a relative reference value based on target statistical values of battery cells, including the battery cell, of the battery, and
the diagnosis circuit is further configured to determine whether or not an error has occurred in the battery cell through a relative determination operation of comparing the target statistical value with the relative reference value and count the number of times of relative error when it is determined that the error has occurred in the battery cell in the relative determination operation.

3. The apparatus of claim 2, wherein
the data processing circuit is further configured to set an 'n' sigma value of the target statistical values as the relative reference value, and
the 'n' is a positive number.

4. The apparatus of claim 2, wherein
the data processing circuit is further configured to calculate the cumulative reference value by calculating and accumulating relative reference values during the analysis period.

5. The apparatus of claim 1, wherein
the data processing circuit is further configured to select target statistical values corresponding to a specific time zone of the analysis period from among the target statistical values of the battery cell, and calculate the cumulative reference value by accumulating the selected target statistical values.

6. The apparatus of claim 1, wherein
the diagnosis circuit is further configured to determine whether or not an error has occurred in the battery cell through an absolute determination operation of comparing the target statistical value with an absolute reference value, and count the number of times of absolute error when it is determined that the error has occurred in the battery cell in the absolute determination operation.

7. The apparatus of claim 1, wherein
when voltages of the battery cell are measured in a charging section and a discharging section of the battery cell, the data processing circuit is further configured to convert the voltages of the battery cell into a differential signal with respect to capacitance and voltage of the battery cell, and calculate the target statistical value based on the differential signal.

8. The apparatus of claim 7, wherein the data processing circuit is further configured to convert the voltage of the battery cell into voltage data in the form of monotonically increasing or monotonically decreasing through sampling of the voltages, calculate differential values by differentiating the converted voltage data, and set a standard deviation of the differential values as the target statistical value.

9. The apparatus of claim of claim 8, wherein the data processing circuit performs sampling of the voltages by classifying capacity values of battery cells having a same voltage magnitude and calculating an average value of capacity values of the battery cells for each voltage magnitude.

10. The apparatus of claim 7, wherein the differential signal is expressed as dQ/dV, where dQ is a change in the capacity and dV is a change in the voltage.

11. The apparatus of claim 7, wherein the data processing circuit converts the voltage of the battery cell so that a slope of the voltage of the battery cell satisfies continuity through a smoothing spline.

12. The apparatus of claim 1, wherein when voltages of the battery cell are measured in a rest section of the battery cell, the data processing circuit is further configured to calculate a fitting value for the voltages of the battery cell, and set an absolute value of a difference between the voltage measured by the voltage measurement circuit and the approximate value as the target statistic value.

13. The apparatus of claim 12, wherein the data processing circuit is further configured to calculate the approximate value according to least square estimation.

14. The apparatus of claim 1, wherein the data processing circuit is further configured to calculate a relative reference value based on target statistical values of battery cells, including the battery cell, of the battery, the diagnosis circuit is further configured to:
   determine whether or not an error has occurred in the battery cell through a relative determination operation of comparing the target statistical value with the relative reference value and counting a number of times of relative error when it is determined that the error has occurred in the battery cell through the relative determination operation,
      determine whether or not the error has occurred in the battery cell through an absolute determination operation of comparing the target statistical value with an absolute reference value and counting a number of times of absolute error when it is determined that the error has occurred in the battery cell through the absolute determination operation, and
      determine that the battery cell is defective when the number of times of absolute error, the number of times of relative error, and the number of times of cumulative error satisfy a diagnostic condition, and the battery cells are battery cells of a battery module including the battery cell.

15. The apparatus of claim 14, wherein the diagnostic condition is that the number of times of absolute error is greater than or equal to a first number of times, the number of times of relative error is greater than or equal to a second number of times, and the number of times of cumulative error is greater than or equal to a third number of times,
the first number of times is related to the number of times of absolute error of the battery cells,
the second number of times is related to the number of times of relative error of the battery cells, and
the third number of times is related to the number of times of cumulative error of the battery cells.

16. A method for diagnosing a battery, comprising:
a voltage measurement step of measuring, by an apparatus for diagnosing, a voltage between an input terminal and an output terminal of a battery cell of the battery;
a calculation step of calculating, by the apparatus for diagnosing a battery, a target statistical value indicating a state of the battery cell based on the voltage measured in the voltage measurement step, and calculating a cumulative statistical value by accumulating target statistical values of the battery cell during an analysis period;
a first diagnosis step of determining, by the apparatus for diagnosing, whether or not an error has occurred in the battery cell through a cumulative determination operation of comparing the cumulative statistical value with a cumulative reference value and counting a number of times of cumulative error when it is determined that the error has occurred in the battery cell through the cumulative determination operation; and
controlling the battery based on the diagnosis from the first diagnosis step.

17. The method of claim 16, wherein the calculation step further includes calculating a relative reference value based on target statistical values of battery cells, including the battery cell, of the battery, the method further comprises
   a second diagnosis step of determining, by the apparatus for diagnosing, whether or not the error has occurred in the battery cell through a relative determination operation of comparing the target statistical value with the relative reference value, and counting a number of relative errors when it is determined that the error has occurred in the battery cell through the relative determination operation,
   a third diagnosis step of determining, by the apparatus for diagnosing, whether or not the error has occurred in the battery cell through an absolute determination operation of comparing the target statistical value with an absolute reference value and counting a number of times of absolute error when it is determined that the error has occurred in the battery cell through the absolute determination operation, and
   a final diagnosis step of determining that the battery cell is defective when it is determined that the number of times of absolute error, the number of times of relative error, and the number of accumulated errors satisfy a diagnosis condition, and providing an alarm to indicate that the battery cell is defective.

18. The method of claim 17, wherein an 'n' sigma value of the target statistical values is set as the relative reference value, and the 'n' is a positive number.

19. The method of claim 17, wherein
the cumulative reference value is calculated by calculating and accumulating the relative reference values during the analysis period.

20. The method of claim 17, wherein
the target statistical values are selected corresponding to a specific time zone of the analysis period from among the target statistical values of the battery cell, and the cumulative reference value is calculated by accumulating the selected target statistical values.

* * * * *